US012107627B2

(12) United States Patent
Tsonev et al.

(10) Patent No.: US 12,107,627 B2
(45) Date of Patent: *Oct. 1, 2024

(54) DISPLAY APPARATUS

(71) Applicant: pureLiFi Limited, Edinburgh (GB)

(72) Inventors: Dobroslav Tsonev, Edinburgh (GB); Istvan P. B. Csajaghy, Edinburgh (GB); Duncan John William Walker, Edinburgh (GB); Ivan Alf Karlsson, Edinburgh (GB); Artur Witold Wieczorek, Edinburgh (GB)

(73) Assignee: PURELIFI LIMITED, Edinburgh (GB)

( * ) Notice: Subject to any disclaimer, the term of this patent is extended or adjusted under 35 U.S.C. 154(b) by 0 days.

This patent is subject to a terminal disclaimer.

(21) Appl. No.: 18/296,305

(22) Filed: Apr. 5, 2023

(65) Prior Publication Data

US 2023/0246711 A1 Aug. 3, 2023

Related U.S. Application Data

(63) Continuation of application No. 17/524,957, filed on Nov. 12, 2021, now Pat. No. 11,750,285, which is a
(Continued)

(30) Foreign Application Priority Data

Jan. 12, 2017 (GB) ..................... 1700530

(51) Int. Cl.
*H04B 10/116* (2013.01)
*G09G 3/32* (2016.01)
(Continued)

(52) U.S. Cl.
CPC ............. *H04B 10/116* (2013.01); *G09G 3/32* (2013.01); *G09G 3/3208* (2013.01); *G09G 5/10* (2013.01);
(Continued)

(58) Field of Classification Search
CPC ... G06F 1/1637; G06T 1/00; G09G 2360/144; G09G 2370/16; G09G 2370/18;
(Continued)

(56) References Cited

U.S. PATENT DOCUMENTS 8,890,773 B1 11/2014 Pederson
9,460,332 B1 10/2016 Bussat
(Continued)

FOREIGN PATENT DOCUMENTS

CN 1607819 4/2005
CN 102592543 7/2012
(Continued)

OTHER PUBLICATIONS

ISA; International Preliminary Report on Patentability dated Jul. 16, 2019 in Application No. PCT/GB2018/050093.
(Continued)

*Primary Examiner* — Dmitriy Bolotin
(74) *Attorney, Agent, or Firm* — SNELL & WILMER L.L.P.

(57) ABSTRACT

A display apparatus comprises an at least partially transparent display, the display configured to generate light to form an image for display to a user positioned in front of the display, and at least one light-transmitting and/or light-receiving device positioned behind the display, wherein the at least one light-transmitting and/or light-receiving device is configured to transmit and/or receive light through at least part of the display, wherein the at least one light-transmitting and/or light-receiving device comprises or forms part of an optical wireless communications (OWC) apparatus configured to transmit and/or receive the light through the at least part of the display.

44 Claims, 7 Drawing Sheets

Related U.S. Application Data continuation of application No. 16/476,286, filed as application No. PCT/GB2018/050093 on Jan. 12, 2018, now Pat. No. 11,283,520.

(51) Int. Cl.
| | |
|---|---|
| *G09G 3/3208* | (2016.01) |
| *G09G 5/10* | (2006.01) |
| *H02S 40/38* | (2014.01) |
| *H04M 1/02* | (2006.01) |
| *H02J 7/35* | (2006.01) |

(52) U.S. Cl.
CPC ........... *H02S 40/38* (2014.12); *H04M 1/0266* (2013.01); *G09G 2360/144* (2013.01); *G09G 2370/16* (2013.01); *G09G 2370/18* (2013.01); *H02J 7/35* (2013.01); *H04M 2201/38* (2013.01)

(58) Field of Classification Search
CPC .......... G09G 3/32; G09G 3/3208; G09G 5/10; H01L 27/3225; H01L 27/3227; H01L 27/326; H02J 7/35; H02S 40/38; H04B 10/11; H04B 10/116; H04M 1/0266; H04M 2201/38
See application file for complete search history.

(56) References Cited

U.S. PATENT DOCUMENTS

| | | | |
|---|---|---|---|
| 9,466,653 | B2 | 10/2016 | de Jong et al. |
| 11,283,520 | B2* | 3/2022 | Tsonev .................... H02S 40/38 |
| 2009/0219273 | A1 | 9/2009 | Nathan |
| 2010/0302194 | A1 | 12/2010 | Park |
| 2011/0043487 | A1 | 2/2011 | Huang |
| 2013/0135328 | A1* | 5/2013 | Rappoport ........... G09G 3/3225 |
| | | | 345/82 |
| 2013/0308073 | A1 | 11/2013 | Yamazaki |
| 2013/0341659 | A1 | 12/2013 | Lin |
| 2014/0010549 | A1 | 1/2014 | Kang |
| 2014/0023378 | A1* | 1/2014 | Bae .................... H04B 10/1143 |
| | | | 398/128 |
| 2014/0176514 | A1 | 6/2014 | Lin |
| 2015/0228089 | A1 | 8/2015 | Perdices-Gonzalez |
| 2016/0308614 | A1 | 10/2016 | Tsonev et al. |
| 2017/0092228 | A1* | 3/2017 | Cote ........................ G09G 5/30 |
| 2017/0294488 | A1* | 10/2017 | Lin ....................... H10K 59/123 |
| 2019/0096966 | A1* | 3/2019 | Rappoport .............. G06F 3/011 |
| 2019/0363792 | A1* | 11/2019 | Tsonev ................. G09G 3/3208 |

FOREIGN PATENT DOCUMENTS

| | | |
|---|---|---|
| CN | 103681774 | 3/2014 |
| CN | 104766572 | 7/2015 |
| EP | 2129103 | 2/2009 |
| GB | 2342522 | 4/2000 |
| JP | 2009153117 | 7/2009 |
| WO | 2015082907 | 6/2015 |
| WO | 2015116217 | 8/2015 |
| WO | 2016129945 | 8/2016 |

OTHER PUBLICATIONS

IEEE International Conference on Wireless for Space and Extreme Environments (WiSEE), 2016, IEEE, pp. 37-41, Bialic et al "Semi-trasparent solar cells indifferent to ambient lighting for Li Fi Application."
Anonymous: "Method for Li-Fi Network Encoded Video Streams on LED TVs Broadcasting to Mobile Devices", IP.com journal, Apr. 26, 2016.
Zeng et al, "Visible light communication system for mobile device", Sixth International Conference on Ubiquitous and Future Networks (ICUFN), 2014, pp. 26-28.
International Searching Authority, International Search Report and Written Opinion dated Jan. 12, 2018 in Application No. PCT/GB2018/050093.
UKIPO, United Kingdom Search Report dated May 16, 2017 in Application No. GB1700530.7.
UKIPO, United Kingdom Search Report dated Mar. 8, 2018 in Application No. GB1800563. 7.
UKIPO, United Kingdom Combined Search and Exam Report dated Mar. 6, 2018 in Application No. GB1800564.5.
UKIPO, United Kingdom Search Report dated Oct. 29, 2018 in Application No. GB1800564.5.
UKIPO, United Kingdom Search Report dated Oct. 19, 2017 in Application No. GB1700530.7.
UKIPO, United Kingdom Search Report dated Oct. 29, 2018 in Application No. GB1800563.7.
USPTO, Non-Final Office Action dated Jun. 26, 2020 in U.S. Appl. No. 16/476,286.
USPTO, Final Office Action dated Apr. 15, 2021 in U.S. Appl. No. 16/476,286.
USPTO, Notice of Allowance dated Aug. 11, 2021 in U.S. Appl. No. 16/476,286.
USPTO, Notice of Allowance dated Sep. 2, 2022 in U.S. Appl. No. 17/524,957.
USPTO, Notice of Allowance dated Jan. 12, 2023 in U.S. Appl. No. 17/524,957.
UKIPO, United Kingdom Exam Report dated Jan. 7, 2019 in Application No. GB1800563.7.
UKIPO, United Kingdom Exam Report dated Mar. 7, 2019 in Application No. GB1800563.7.
UKIPO, United Kingdom Exam Report dated Apr. 2, 2019 in Application No. GB1800563.7.
UKIPO, United Kingdom Exam Report dated Jan. 7, 2018 in Application No. GB1800564.5.
UKIPO, United Kingdom Exam Report dated Mar. 12, 2019 in Application No. GB1800564.5.
European Patent Office, European Office Action dated Jul. 16, 2021 in Application No. 18700824.8.
Sunpartner Technologies, "Mobile Devices", https://sunpartnertechnologies.com/mobile-devices/, retrieved Feb. 12, 2022, 4 pages.
CNIPA, Chinese Office Action dated Dec. 5, 2022 in Application No. 201880006367.0.

* cited by examiner

DISPLAY APPARATUS

CROSS-REFERENCE TO RELATED APPLICATIONS

This application is a continuation of, claims priority to and the benefit of, U.S. Ser. No. 17/524,957 filed on Nov. 12, 2021 and entitled "Display Apparatus." The '957 application is a continuation of, claims priority to and the benefit of, U.S. Ser. No. 16/476,286 filed on Jul. 6, 2019, now U.S. Pat. No. 11,283,520 issued Mar. 22, 2022 and entitled "Display Apparatus." The '286 application claims priority to and the benefit of PCT Application No. PCT/GB2018/050093 filed on Jan. 12, 2018 and entitled "Display Apparatus." The '093 PCT application claims priority to and the benefit of United Kingdom Provisional Patent Application No. 1700530.7, filed Jan. 12, 2017. All of the foregoing disclosures are hereby incorporated by reference for all purposes in their entirety.

TECHNICAL FIELD

The present invention relates to a display apparatus for an electronic device with at least one integrated opto-electronic component, for example a display apparatus for an electronic device with an integrated optical wireless communication transceiver.

BACKGROUND

Many electro-optical components may require light reception and/or light transmission for their operation. Such components may include, but are not limited to, optical wireless communication (OWC) transceivers, light-based motion detectors, cameras, optical sensors, solar cells, proximity sensors, or flashlights.

Electro-optical components that require light reception and/or light transmission for their operation may require a sufficiently unobstructed path between an optical detector or transmitter and an outside environment.

Visible light captured by a sensor of a camera may require a substantially unobstructed path between the image that is being captured and the sensor. Infrared (IR) light emitted and received by a proximity sensor may require a sufficiently unobstructed path between the proximity sensor and incoming IR radiation in order to make a detection. An OWC transmitter may require a sufficiently unobstructed path to successfully emit radiation (for example, IR light) that is used for uplink (UL) communication. An OWC receiver may require a sufficiently unobstructed path to successfully receive radiation (for example, visible light radiation) that is used for downlink (DL) communication.

In many known devices, electro-optical components are placed at or near the surface of an electronic device (for example, a mobile phone, tablet, laptop or other computer). For example, optics for a camera, proximity sensor, OWC transmitter or OWC receiver, or other light-receiving or light-emitting components, may be integrated at a surface of a user device into which the components are embedded. Electro-optical components may be placed towards the edge of a device to avoid blocking or being blocked by other components of the device.

FIG. 1 is a schematic illustration of a mobile phone comprising an integrated camera module and an integrated proximity sensor. A front surface of the mobile phone 10 (where the front surface is the surface typically viewed by a user) comprises a display screen region 12, a first bezel region 14 and a second bezel region 16. Each bezel region 14, 16 comprises a region of a front surface of the phone that does not provide display functionality. A camera 18 and proximity sensor 20 are integrated into the first bezel region 14 of the mobile phone 10.

The display screen region 12 may comprise, for example, a display comprising a liquid crystal (LCD) layer and an array of LEDs positioned behind the LCD layer. The LEDs are configured to provide backlighting of the LCD layer (which does not itself produce light).

Optics for the camera 18 and proximity sensor 20 are integrated at the surface of the mobile phone 10. As a consequence, the camera 18 and the proximity sensor 20 are integrated at the side of the screen (i.e. outside the display screen region 12) in a bezel region (first bezel region 14), where there is available space for components of the camera 18 and proximity sensor 20.

An OWC module may be integrated into a bezel region of a mobile phone in a similar fashion such that light incident on the mobile phone may be collected by an optical detector of the OWC module. Light emitted by an optical transmitter of the OWC module may need to be able to escape from the device and radiate as desired by an optical front-end designer. Transmitter (TX) and/or receiver (RX) optics of the OWC device may be positioned at the surface of the bezel analogously to the camera 18 and proximity sensor 20 depicted in FIG. 1.

There may be limited space in the bezel regions 14, 16. The limited space in the bezel 14, 16 may put a significant constraint on the size of an OWC module and on additional modules that may be placed in the bezel.

Recent phone designs have seen a tendency to decrease the size of the bezel region or regions, and it is thought that some designers may wish to eliminate the bezel entirely (for example, by creating a design in which the display screen covers the entirety of a front surface of the phone).

It is known to provide a transparent solar cell module that may be integrated on top of a mobile phone screen such that the mobile phone may still be used as intended while energy is harvested by the solar cell. It has been suggested that the solar cell may potentially be used as an OWC detector. However, the nature of a transparent solar cell is that most of the light is passed through the solar cell, while harvesting only a small amount of the incident light. If this were not the case, then the solar cell would not be transparent, which may lead to a degradation of the display image emitted by the display underneath the solar cell. Solar cells may be too slow for the high-speed data rates used in modern wireless communication standards, which may limit the use of a transparent solar cell as an OWC detector.

SUMMARY

In a first aspect of the invention, there is provided a display apparatus comprising: an at least partially transparent display; and at least one light-transmitting and/or light-receiving device positioned behind the display; wherein the at least one light-transmitting and/or light-receiving device is configured to transmit and/or receive light through at least part of the display. The display may be configured to generate light to form an image for display to a user, for example a user positioned in front of the display. The at least one light-transmitting and/or light-receiving device may comprise or form part of an optical wireless communications (OWC) apparatus configured to transmit and/or receive the light through the at least part of the display.

The at least one light-transmitting device may be configured to transmit modulated light comprising an uplink data signal to a further OWC device. The OWC apparatus, for example a transceiver of the OWC apparatus, may be configured to encode the uplink data signal in the transmitted modulated light. The at least one light-receiving device may be configured to receive modulated light comprising a downlink data signal from the further OWC device. The OWC apparatus, for example a transceiver of the OWC apparatus, may be configured to decode the received modulated light to obtain the downlink data signal encoded in the received modulated light.

The display may comprise one or more layers. For example, the display may comprise a plurality of sub-layers that together provide display functionality. The at least one light-receiving device may comprise at least one light detector.

The at least partial transparency of the display allows light to pass through at least part of the display. Therefore, a light-transmitting and/or light-receiving device may be placed behind the display layer rather than being placed in a region outside the display (for example, a bezel region). In some circumstances, placing one or more light-transmitting and/or light-receiving devices behind the display rather than in a bezel may allow the size of the bezel to be reduced, or may allow the bezel to be removed entirely.

A light-transmitting and/or light-receiving device may in some circumstances be made larger than if it were to be placed in a bezel. The light-transmitting and/or light-receiving device or devices may be placed over an area that comprises a substantial part of the display screen area.

A plurality of light-transmitting and/or light-receiving devices may be positioned on a single layer behind the display screen. Different light-transmitting and/or light-receiving devices may be positioned on different layers behind the display screen. In some circumstances, the light-receiving and/or light-receiving devices may be separate modules. The separate modules may be positioned next to each other behind the display screen. The separate modules may be positioned behind the display screen such that there is no clear definition of layers to which the separate modules belong.

The light-transmitting and/or light-receiving device may be camouflaged by the presence of the display. An image may be displayed on the display that may obscure a user's view of the light-transmitting and/or light-receiving device behind the display.

The display may be substantially planar. The positioning of the at least one light-transmitting and/or light-receiving device behind the display may comprise positioning the at least one light-transmitting and/or light-receiving device on an opposite side of a plane of the display from a side from which the display is viewed by the user.

The at least partially transparent display may be at least partially transparent to at least one of visible light, ultraviolet light, infrared light.

The transparency of the display may be independent of the image displayed on the display. The extent to which the display is transparent may not vary in dependence on image content, for example image colour and/or intensity.

The display may comprise a plurality of at least partially transparent display elements.

The plurality of at least partially transparent display elements may each provide a respective pixel of an image displayed by the display. The plurality of display elements may comprise display elements of different colours, for example red, green and blue display elements. The display screen may further comprise a plurality of non-transparent display elements.

The at least partially transparent display elements may comprise transparent organic light-emitting diodes (TOLEDs).

The at least partially transparent display elements comprise at least one of: microLEDs, quantum dot LEDs or lightfield display elements.

The at least one light-transmitting and/or light-receiving device may be independent of the at least partially transparent display elements. The at least one light-transmitting and/or light receiving device may operate at a different wavelength and/or modulation speed and/or power output from the at least partially transparent display elements.

The at least one light-transmitting and/or light-receiving device may comprise at least one electro-optic device, optionally an array of electro-optic devices. The at least one light transmitting and/or light receiving device may comprises at least one of: at least one transceiver; at least one LED, optionally at least one microLED, quantum dot LED or lightfield display element.

The at least one light-transmitting and/or light-receiving device may comprise or form part of an optical wireless communications (OWC) apparatus, for example an OWC transceiver, an OWC receiver, an OWC transmitter. The at least one light-transmitting and/or light-receiving device may comprise a light-based motion detector, a camera, a solar cell, a proximity sensor, a flashlight, a light level detector.

Light transmitted and/or received by the at least one light-transmitting and/or light-receiving device may comprise at least one of visible light, infrared light, ultraviolet light.

Light transmitted by the at least one light-transmitting and/or light-receiving device may have the same wavelength as light generated by the display. For example, the display may be configured to generate light in the visible spectrum and the at least one light-transmitting and/or light-receiving device may also be configured to transmit visible light. The transmitting of light by the at least one light-transmitting and/or light-receiving device may be independent of the generating of light by the display.

Light transmitted by the at least one light-transmitting and/or light-receiving device may be different from light generated by the display. For example, the display may generate visible light, and the at least one light-transmitting and/or light-receiving device may transmit infrared light. The transmitted infrared light may not be perceived by the user. As a further example, the display may generate visible light, and the at least one light-transmitting and/or light-receiving device may transmit non-visible light.

By using at least one light-transmitting and/or light-receiving device which is not part of the display to transmit light, the light transmitted may be independent of an image displayed on the screen. Parameters of the light transmitted by the at least one light-transmitting and/or light-receiving device may not be affected by changes in the image displayed on the screen, for example by changes in image colour or intensity. For example, the light transmitted by the at least one light-transmitting and/or light-receiving device may have a wavelength and/or intensity that does not vary with image content.

LEDs that are part of the display may in some circumstances not be suitable for communication. Using a separate light-transmitting device may allow communication to be implemented without affecting the display.

Light transmitted and/or received by the OWC transmitter and/or receiver may comprise at least one of visible light, ultraviolet light, infrared light. Light transmitted by the OWC transmitter may comprise infrared light. Light received by the OWC receiver may comprise visible light.

The OWC transmitter and/or receiver may comprise a light fidelity (LiFi) transmitter and/or receiver. Light transmitted by the OWC transmitter may comprise a LiFi uplink signal. Light received by the OWC receiver may comprise a LiFi downlink signal.

The OWC transmitter and/or receiver may be configured to modulate the light transmitted through the at least part of the display to encode data in the transmitted light, for example in accordance with a modulation scheme. The OWC transmitter and/or receiver may be configured to demodulate the light received through the at least part of the display to obtain data encoded in the received light, for example data encoded in accordance with the or a modulation scheme.

The modulation scheme may comprise at least one of on-off keying (OOK), phase shift keying (PSK), M-ary pulse amplitude modulation (M-PAM), M-ary quadrature amplitude modulation (M-QAM) or orthogonal frequency division multiplexing (OFDM).

The at least one light-transmitting and/or light-receiving device may comprise at least one solar cell.

The at least one solar cell may be configured to at least partially power the display apparatus. The at least one solar cell may be configured to at least partially power an electronic device into which the display apparatus is incorporated. The at least one solar cell may be configured to charge a battery.

The at least one solar cell may be configured to detect light signals. The light signals may comprise communication signals. The at least one solar cell may be configured to detect light level. The light level may comprise an ambient light level.

By placing a solar cell behind the display, the solar cell may be made larger than if it were placed in a non-display region, for example in a bezel. The solar cell or cells may occupy a large proportion of the display region, for example more than 20% of the display region, optionally more than 50% of the display region, further optionally more than 80% of the display region. An increased solar cell area may result in increased solar power being captured. Battery life of the electronic device may be extended.

The at least one light-receiving and/or light-transmitting device may comprise at least one of a light-based motion detector, a camera, a proximity sensor, a flashlight, a light level detector.

The at least one light-receiving and/or light-transmitting device may comprise at least one large area photodetector. The at least one large area photodetector may occupy an area of at least 10 mm$^2$, optionally at least 20 mm$^2$, further optionally at least 50 mm$^2$, further optionally at least 100 mm$^2$, further optionally at least 200 mm$^2$. The at least one large area photodetector may occupy at least 10% of the display region, optionally at least 20% of the display region, further optionally at least 50% of the display region.

The at least one light-receiving and/or light-transmitting device may comprise a plurality of photodetectors.

The use of large area and/or multiple photodetectors may allow light to be captured over a larger area than in some existing systems. In some circumstances, the use of large area and/or multiple photodetectors may lead to a reduction or elimination of optics associated with the at least one light-receiving and/or light-transmitting device.

The at least one light-transmitting and/or light-receiving device may be positioned such that no additional optical components are positioned between the at least one light-transmitting and/or light-receiving device and the display.

The at least one light-receiving and/or light-transmitting device may comprise a plurality of transmitters. The transmitters may be scattered across the display region.

The at least one light-receiving and/or light-transmitting device may comprise at least one large area transmitter. The at least one large area transmitter may occupy an area of at least 10 mm$^2$, optionally at least 20 mm$^2$, further optionally at least 50 mm$^2$, further optionally at least 100 mm$^2$, further optionally at least 200 mm$^2$. The at least one large area transmitter may occupy at least 10% of the display region, optionally at least 20% of the display region, further optionally at least 50% of the display region.

Using scattered and/or large area transmitters may distribute radiated light (for example, radiated infrared light) over a larger area. Distributing radiated light over a larger area may allow the relaxation of constraints relating to eye safety. For example, it may be possible to radiate a higher total amount of light than would be possible if the light were to be radiated from a smaller transmitter or from fewer transmitters.

The display apparatus may further comprise means for processing signals representative of light received by the at least one light-transmitting and/or light-receiving device.

The means for processing, for example a processor, software and/or hardware arrangement, may be configured to process the signals representative of light received by the at least one light-transmitting and/or light-receiving device to identify, compensate for and/or at least partially remove a component of the signals that is representative of light emitted by at least part of the display.

At least part of the display may emit light backwards. At least part of the display may emit light towards the light-transmitting and/or light-receiving device as well as emitting light towards the user. The processor may distinguish between light received through the display (which may comprise a desired signal) and light that has been emitted by the display (which may comprise unwanted interference). The processor may process light received by any light-transmitting and/or light-receiving device that has at least one photosensitive element, for example a communication receiver, camera sensor, or proximity sensor.

The processing of the signals may be based on at least one of: a wavelength of the signals; a frequency of modulation of the signals. Interference may be estimated as it is slowly changing relative to the speed of a communication system, and may be removed or reduced with digital processing.

The processing of the signals may comprise filtering the signals by wavelength. The processing of the signals may comprise filtering the signals by a frequency of modulation. A light transmitting and/or light-receiving device may comprise an OWC device configured to receive a modulated light signal, for example a baseband modulated signal modulated at a modulation frequency between 1 Hz and 100 GHz, optionally between 1 MHz and 100 GHz, optionally between 100 kHz and 1 PHz. Light emitted by the display may appear to the processor as a low-frequency interference signal added to a received OWC signal. For example, an image displayed on the display may be displayed at a refresh rate of between 30 Hz and 200 Hz.

The display apparatus may be configured to at least partly compensate for optical effects of the display, for example the display apparatus may comprise means for at least partly compensating for optical effects arising from the display.

Optical effects of the display may be such as to change a propagation profile of light passing through the display. Optical effects of the display may comprise a change in at least one parameter of light transmitted and/or received through the at least part of the display. The at least one parameter may comprise at least one of: a propagation profile parameter, a wavelength, a polarisation parameter, a direction, an aberration parameter, a dispersion parameter, a refraction parameter, a diffraction parameter.

The display apparatus may comprise at least one optical component configured to compensate for optical effects of the display. The compensating of the optical effects of the display may comprise altering, by at least one optical component of the display, a value for at least one parameter of the light transmitted and/or received by the at least one light-transmitting and/or light-receiving device.

For example, the at least one optical component may comprise at least one lens. As a further example, the at least one optical component may comprise at least one of: a lens array, a microlens array, liquid crystal displays, polarizers.

The at least one optical component may comprise one or more filters. For example, the one or more filters may comprises at least one of: an absorption filter; an interference filter; a Fabry-Perot filter; a dichroic filter; a band-pass filter; a tuneable filter; a plasmonic filter.

The compensating of the optical effects of the display may comprise performing, by the or a processor of the display apparatus, signal processing of light transmitted and/or received by the at least one light-transmitting and/or light-receiving device. The signal processing may comprise digital signal processing. The signal processing may comprise analogue signal processing.

The compensating of the optical effects of the display may allow the at least one light-transmitting and/or light-receiving device to perform as if, or almost as if, the display were not present. As a result of the compensating, the transmitting or receiving of signals may not be substantially affected by the presence of the display in front of the at least one light-transmitting and/or light-receiving device.

The display apparatus may be configured to alter at least one property of light emitted by at least part of the display and/or to alter operation of the display, during a time period in which light is transmitted and/or received by the at least one light-transmitting and/or light-receiving device through at least part of the display. The at least one property may comprise intensity. The altering of the at least one property of the light may comprise at least one of reducing the intensity of the light emitted by the at least part of the display, and/or turning off the at least part of the display. The display apparatus may be configured to turn off at least part of the display during a time period in which light is received by the at least one light-transmitting and/or light-receiving device through at least part of the display.

Altering an intensity of light emitted by at least part of the display while light is received through the display may prevent light emitted backwards from the display from affecting the light received by the at least one light-transmitting and/or light-receiving device through the display. In some circumstances, turning off the at least part of the screen may remove light originating from the display in a more effective manner than using signal processing to remove that light. The display apparatus may be configured such that the at least part of the display is only turned off, or has its intensity reduced, for a short time period. For example, the time period may be between 0.001 seconds and 1 second, optionally between 0.001 seconds and 0.1 second, further optionally between 0.01 second and 0.1 second.

The altering of the intensity of the at least part of the display may be synchronised with a modulation of a signal that is being transmitted or received.

The at least one light-transmitting and/or light-receiving device may comprise sensor elements of a camera. The time period may comprise a time period in which an image is acquired by the camera.

By turning off at least part of the display during image acquisition by the camera, the image may be acquired without requiring signal processing to remove light originating from the display. The received light may comprise less interference than if the display were to be switched on during image acquisition.

The at least one light-transmitting and/or light-receiving device and the plurality of display elements may be configured such that light from the plurality of display elements does not saturate the at least one light-transmitting and/or light-receiving device.

The at least one light-transmitting and/or light-receiving device may be configured to receive both light passing through the display and light originating from the display, without saturating.

The display apparatus may further comprise an at least partially transparent cover layer positioned in front of the display. The display apparatus may further comprise a capacitive layer positioned in front of the display. The display apparatus may further comprise a backplane layer on which the at least one light-transmitting and/or light-receiving device is mounted.

The display may be part of an integrated display screen. The at least one light-transmitting and/or light-receiving device may be positioned behind the integrated display screen. The integrated display screen may comprise at least one of: an at least partially transparent cover layer, a capacitive layer, a backplane layer. The integrated display screen may be packaged in a package that does not contain the at least one light-transmitting and/or light-receiving device.

Positioning the at least one light-transmitting and/or light-receiving device behind the integrated display screen may camouflage the at least one light-transmitting and/or light-receiving device behind the integrated display screen such that they are not visible to a user.

Using an at least partially transparent display screen may allow the at least one light-transmitting and/or light-receiving device to be fabricated separately from the display screen and then placed behind the display screen at an assembly stage.

The at least one light-transmitting and/or light-receiving device may comprise a plurality of different light-transmitting and/or light-receiving devices.

Several different types of device may be integrated behind a single display. For example, an OWC transceiver, a proximity sensor and a solar cell may be integrated into a single device. By integrating several light-transmitting and/or light-receiving devices into a display region, a non-display region (for example a bezel region) may be reduced or eliminated.

In a second aspect of the invention, which may be provided independently, there is provided a method of operating a display apparatus comprising an at least partially transparent display and at least one light-transmitting and/or light-receiving device positioned behind the display, the method comprising: by the at least one light-transmitting and/or light-receiving device, transmitting and/or receiving light through at least part of the display, for example thereby to provide optical wireless communication (OWC) using the modulated light. The method may comprise displaying by the display an image, for example to a user positioned in front of the display.

In a further aspect of the invention, which may be provided independently, there is provided a display apparatus comprising an optical wireless communication (OWC) apparatus and a display, the display comprising an array of elements comprising:

a plurality of display elements comprising red, green and blue elements configured to display an image to a user; and a plurality of light-transmitting elements configured to transmit modulated light comprising a data signal, for example an uplink data signal, to a further OWC device, wherein the OWC apparatus is configured to encode the data signal in the transmitted modulated light; and/or a plurality of light-receiving elements configured to receive modulated light comprising a data signal, for example a downlink data signal, from the or a further OWC device, wherein the OWC apparatus is configured to decode the received modulated light to obtain the data signal encoded in the received modulated light;

wherein at least one of a) or b):

a) the light-transmitting and/or light-receiving elements are distributed in the display in groups of one or more light-transmitting and/or light-receiving elements, wherein one or more said groups are at least partially surrounded by display elements, such that the array of elements comprises a repeating arrangement of unit cells, each unit cell comprising at least one light-transmitting and/or light-receiving element, at least one red element, and least one green element and at least one blue element; or b) the light-transmitting and/or light-receiving elements are arranged in one or more rows or columns within or at the edge of the display.

In a further aspect of the invention, which may be provided independently, there is provided a display apparatus comprising a display, the display comprising an array of elements comprising: a plurality of display elements configured to display an image to a user; and a plurality of light-transmitting and/or light-receiving elements; wherein the light-transmitting and/or light-receiving elements are: distributed in the display in groups of one or more light-transmitting and/or light-receiving elements, wherein one or more said groups are at least partially surrounded by display elements; or arranged in one or more rows or columns within or at the edge of the display.

By interspersing light-transmitting and/or light-receiving elements between display elements, the light-transmitting and/or light-receiving elements may be integrated into a display region without the display elements being transparent.

The plurality of light-transmitting and/or light-receiving elements may comprise a plurality of photodiodes and/or a plurality of LEDs.

The plurality of light-transmitting and/or light-receiving devices may comprise at least one of avalanche photodiodes (APDs), single-photon avalanche photodiodes (SPADs), photomultiplier tubes, solar cells, photodiodes operated in a solar cell mode (forward biased).

The plurality of light-transmitting and/or light-receiving devices may comprise at least one of LEDs, laser diodes.

The array may comprise a repeating arrangement of unit cells, each unit cell comprising at least one light-transmitting and/or light-receiving element and a plurality of display elements.

The light transmitting and/or light-receiving elements may be distributed in the display in groups of one or more light-transmitting and/or light-receiving elements, wherein one or more said groups are at least partially surrounded by display elements, such that the array of elements comprises a repeating arrangement of unit cells, each unit cell comprising at least one light-transmitting and/or light-receiving element, at least one red element, and least one green element and at least one blue element.

The plurality of light-transmitting elements may be configured to transmit modulated light comprising an uplink data signal to a further OWC device, wherein the OWC transceiver is configured to encode the uplink data signal in the transmitted modulated light. The plurality of light-receiving elements may be configured to receive modulated light comprising a downlink data signal from the further OWC device, wherein the OWC transceiver is configured to decode the received modulated light to obtain the downlink data signal encoded in the received modulated light.

A modulation frequency of the transmitted modulated light may be between 100 KHz and 1 PHz. A modulation frequency of the received modulated light may be between 100 KHz and 1 PHz.

A modulation frequency of the transmitted modulated light may be between 1 MHz and 100 GHz. A modulation frequency of the received modulated light may be between 1 MHz and 100 GHz.

The transmitted modulated light may have a wavelength that is different from wavelengths of the visible light emitted by the display elements. The transmitted modulated light may be non-visible light. The transmitted modulated light may be infrared light.

Each of the light-transmitting elements may have a different output power than each of the display elements.

The light-receiving elements may be arranged in more than one light-receiving regions, such that each light-receiving region is configured to receive light having a different wavelength.

The display apparatus may comprise signal collection circuitry for each light-receiving region configured to collect detection signals from each light-receiving element in the light-receiving region and further configured to synchronize collection of detection signals over the light-receiving region.

A modulation scheme used to encode the transmitted modulated light and/or a modulation scheme used to decode the received modulated light may comprise at least one of: on-off keying (OOK), phase shift keying (PSK), M-ary pulse amplitude modulation (M-PAM), M-ary quadrature amplitude modulation (M-QAM) or orthogonal frequency division multiplexing (OFDM).

The plurality of light-receiving elements may comprise a plurality of photodiodes and the plurality of transmitting elements may comprise a plurality of LEDs and/or laser diodes.

The display may comprise one or more layers. For example, the display may comprise a plurality of sub-layers that together provide display functionality.

The display may comprise a plurality of at least partially transparent display elements.

The at least partially transparent display elements may comprise transparent organic light-emitting diodes (TOLEDs).

The at least partially transparent display elements may comprise at least one of: microLEDs, quantum dot LEDs or lightfield display elements.

The display apparatus further may comprise a plurality of non-transparent display elements.

The array of elements may further comprise a plurality of optical front end circuitry elements.

Each unit cell may comprise at least one optical front end circuitry element. At least one of the optical front end circuitry elements may be arranged in one or more rows or columns within or at the edge of the display.

The at least one of optical front end circuitry element may comprise: amplifying circuitry elements, buffering circuitry elements or multiplexing circuitry elements.

The at least some of the display elements may be at least partially transparent. The display apparatus may further comprise at least one further light-transmitting device and/or light-receiving device positioned behind the display. The at least one further light-transmitting and/or light-receiving device may be configured to transmit and/or receive light through at least part of the display.

The red, green and blue elements may be configured to transmit modulated light comprising an uplink data signal to a further OWC device.

The plurality of light-transmitting elements and plurality of light-receiving elements may comprise at least one solar cell.

The at least one solar cell may be configured to at least partially power the display apparatus. The at least one solar cell may be configured to at least partially power an electronic device into which the display apparatus is incorporated. The at least one solar cell may be configured to charge at least one battery.

The at least one solar cell may be configured to detect light signals. For example, the light signals may comprise communication signals. The at least one solar cell may be configured to detect light levels. For example, the light levels may comprise ambient light levels.

The display apparatus may further comprise a means for processing signals representative of light received by the at least one light-receiving device to identify, compensate for and/or at least partially remove a component of the signals that is representative of light emitted by at least part of the display.

The display apparatus may comprise means for at least partly compensating for optical effects arising from the display. The means for at least partly compensating for optical effects arising from the display may comprise at least one optical component configured to compensate for optical effects of the display.

The at least one optical component may comprise at least one of: a lens, a lens array, a microlens array, liquid crystal displays, polarizers.

The at least one optical component may comprise one or more filters. For example, the at least one optical component may comprise at least one of: an absorption filter; an interference filter; a Fabry-Perot filter; a dichroic filter; a band-pass filter; a tuneable filter; a plasmonic filter.

The compensating of the optical effects of the display may comprise at least one of: a) altering, by at least one optical component of the display, a value for at least one parameter of the light transmitted and/or received by the at least one light-transmitting and/or light-receiving device; b) performing, by a processor of the display apparatus, signal processing of light transmitted and/or received by the at least one light-transmitting and/or light-receiving device, for example, wherein the signal processing comprises analogue or digital signal processing.

The display apparatus may be configured to alter at least one property of light emitted by at least part of the display. The display apparatus may be configured to alter operation of the display during a time period in which light is transmitted by the at least one light-transmitting device through at least part of the display. The display apparatus may be configured to alter operation of the display during a time period in which light is received by the at least one light-receiving device through at least part of the display.

The display apparatus may be configured such that the at least part of the display is only turned off, or has its intensity reduced, for a short time period. The display apparatus may be configured such that the at least part of the display is only turned off, or has its intensity reduced, for a short time period in synchronisation with a modulation of a signal that is being transmitted or receiver. The time period may be between 0.001 seconds and 1 second. The time period may be between 0.001 seconds and 0.1 second. The time period may be between 0.01 second and 0.1 second.

The light-transmitting device may be camouflaged by the presence of the display. The light-receiving device may be camouflaged by the presence of the display.

There may be provided an electronic device comprising a display apparatus as claimed or described herein. There may be provided an electronic device comprising a display apparatus in accordance with the first aspect or the third aspect. The electronic device may comprise at least one of a mobile phone, a tablet, a computer, a laptop. The electronic device may comprise at least one of an automotive display, an aviation cockpit display, a television, a financial transaction terminal, an industrial control panel.

In a further aspect, which may be provided independently, there is provided a method of providing optical wireless communication (OWC) comprising:

providing a plurality of display elements comprising red, green and blue elements configured to display an image to a user; and providing a plurality of light-transmitting elements configured to transmit modulated light comprising a data signal, for example an uplink data signal, to a further OWC device, wherein the OWC apparatus is configured to encode the data signal in the transmitted modulated light; and/or providing a plurality of light-receiving elements configured to receive modulated light comprising a data signal, for example a downlink data signal, from the or a further OWC device, wherein the OWC apparatus is configured to decode the received modulated light to obtain the data signal encoded in the received modulated light;

wherein at least one of a) or b):

c) the light-transmitting and/or light-receiving elements are distributed in the display in groups of one or more light-transmitting and/or light-receiving elements, wherein one or more said groups are at least partially surrounded by display elements, such that the array of elements comprises a repeating arrangement of unit cells, each unit cell comprising at least one light-transmitting and/or light-receiving element, at least one red element, and least one green element and at least one blue element; or d) the light-transmitting and/or light-receiving elements are arranged in one or more rows or columns within or at the edge of the display.

There may also be provided an apparatus or method substantially as described herein with reference to the accompanying drawings.

Any feature in one aspect of the invention may be applied to other aspects of the invention, in any appropriate combination. For example, features of the first aspect may be applied to features of the third aspect and vice versa. For example, apparatus features may be applied to method features and vice versa.

BRIEF DESCRIPTION OF THE DRAWINGS

Embodiments of the invention are now described, by way of non-limiting examples, and are illustrated in the following figures, in which.

DETAILED DESCRIPTION

Figure 1:
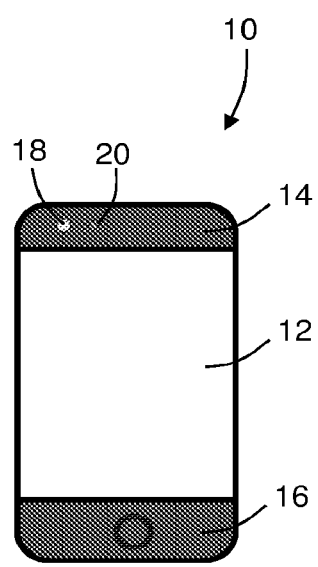
FIG. 1 is a schematic illustration of a mobile phone.
Figure 2:
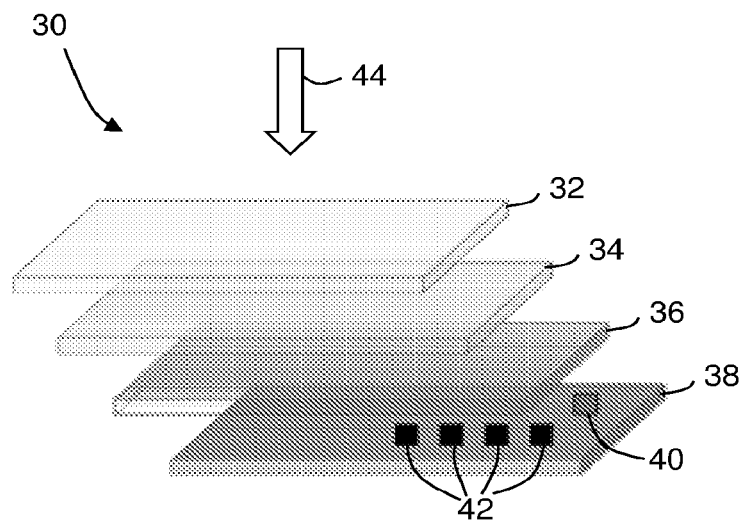
FIG. 2 is a schematic illustration of an integrated LiFi enabled screen using a transparent organic light-emitting diode (TOLED) display matrix in accordance with an embodiment.

FIG. 2 is a schematic illustration of a LiFi enabled screen 30 in accordance with an embodiment. The LiFi enabled screen 30 may be positioned in a display screen region of a mobile phone or of another device. For example the LiFi enabled screen may be used in another mobile computing device such as a tablet or laptop, or in a desktop computer. The LiFi enabled screen 30 may be included in any device that has a display screen, for example in a household appliance or point of sale device. The LiFi enabled screen 30 may be referred to as a display apparatus.

The LiFi enabled screen 30 comprises a plurality of substantially planar layers. FIG. 2 shows the layers viewed side-on in an exploded view. The layers are represented such that the layer closest to the front surface of the mobile phone is positioned at the top of FIG. 2. Although in the present embodiment, the layers are planar and rectangular, in other embodiments the layers may have any appropriate shape.

In the embodiment of FIG. 2, the layers of the LiFi enabled screen 30 comprise a cover layer 32, capacitive layer 34, display layer 36 and backplane 38.

The cover layer 32 is positioned at the front surface of the mobile phone, is substantially transparent, and is configured to protect components of the mobile phone. In the present embodiment, the cover layer 32 is a protective glass layer 32. In other embodiments, any suitable material may be used.

In the present embodiment, the capacitive layer 34 is a capacitive circuit plane 34 positioned directly behind the cover glass 32, and may be used to provide touch screen functionality.

The display layer 36 is positioned directly behind the capacitive layer 36 and comprises a matrix of transparent organic light-emitting devices (TOLEDs). The matrix of TOLEDs forms a display configured to generate light to form an image. The matrix of TOLEDs is an array of red, blue and green TOLEDs, which may also be referred to as display elements or pixels. Each of the TOLEDs is substantially transparent to visible light and may also be substantially transparent to infrared light. The TOLEDs may emit light backwards into the mobile phone as well as forwards towards a user.

TOLEDs have made a commercial appearance over the past 5 years, where different electronics companies have begun offering fully or near-fully transparent displays employing TOLED technology. A difference between a TOLED and some other types of OLED or LED is that the materials used to build the TOLED are almost completely transparent. A transparent LED display matrix may be built using TOLEDs. TOLED technology may be used in transparent display devices and display window products.

In other embodiments, the display layer may be formed of any material that is at least partially transparent. The display layer may be formed using any technology that enables a transparent display layer to be built.

In some embodiments, the display layer comprises an array of any suitable red, green and blue display elements that are each at least partially transparent. In some embodiments, the display layer comprises some transparent and some non-transparent display elements. For example, transparent red LEDs may be used in combination with non-transparent blue LEDs. The display layer may comprise a plurality of sub-layers.

The backplane layer 38 is positioned directly behind the TOLED matrix 36. A plurality of electro-optical devices are mounted on an upper surface of backplane layer 38. In the present embodiment, the electro-optical devices comprise an IR LED 40 and a plurality of photodiodes 42. The IR LED 40 and plurality of photodiodes 42 are coupled to an OWC transceiver 52 (not shown in FIG. 2). In the present embodiment, the TOLEDs may emit light in both directions, such that some light from the TOLEDs is incident on the photodiodes 42. The photodiodes 42 are therefore configured such that they are not saturated by light from the TOLEDs.

Although in the present embodiment, the screen 30 comprises a cover layer 32, capacitive layer 34, display layer 36 and backplane layer 38, in other embodiments, additional layers may be included. One or more of the layers of the embodiment of FIG. 2 may be omitted. Layers may be placed in a different order. In some embodiments, circuitry driving the display layer 36 is positioned on a different layer from the display layer 36 itself. For example, driving circuitry may be positioned on or behind the backplane layer 38.

The wiring of the electro-optical devices and/or the wiring of other components may be performed using any suitable techniques, practices and materials, for example using established techniques, practices and materials from the field of display manufacturing.

In some embodiments, the screen 30 further comprises at least one optical filter and/or optical amplifier positioned on top of the photodiodes 42. At least one optical filter and/or optical amplifier may be positioned directly in front of the photodiodes 42, or between or in front of any layers that are in front of the photodiodes 42. Optical filters and/or optical amplifiers may be positioned in any order.

Some principles of optical wireless communication are now described. A transmitter apparatus is configured to send wireless optical signals in which information is encoded through an optical communication channel to a receiver apparatus. The optical communication channel may be a free-space communication channel. The optical communications channel has a characteristic optical wavelength. A channel may established and/or operated by way of transmission and/or reception of uplink and/or downlink signals.

Free space communication channels include transmission of optical signals through air, space, vacuum, liquid such as water or similar. Free space communication may exclude communication through solid material.

Transmitters and receivers may be provided on different devices. One type of device that is used is an access point. Access points may provide access to a further network. Another type of device is a station. Stations may be portable or fixed. Without limitation, examples of stations include personal computers, desktops, laptops and smart devices, including mobile devices. Portable stations may be powered by their own battery resource.

An access point may provide data transmission to and/or from a wired network or a Wi-Fi™ (wireless fidelity) or other wireless network and/or other optical wireless communications network, optionally a LiFi network.

The transmitter apparatus includes a light emitting diode (LED), laser or other suitable light source, and an associated driving circuit to drive the LED or laser to produce the optical signal. The associated driving circuitry includes a digital to analogue convertor configured to provide a modulation signal at a frequency characteristic of an optical light communication signal. A further processor, provided as part of the transmitter apparatus or associated with the transmitter apparatus, modulates data onto a drive current and the driving circuitry provides the drive current to the LED or laser. The LED or laser then produces an outgoing modulated optical wireless communication signal that carries the data.

The receiver apparatus includes a photodiode, or other suitable light detector, with associated circuitry to condition any received signal. The photodiode converts received light to an electronic signal which is then conditioned by the conditioning circuitry. Conditioning may include one or more filter steps; amplification of a weak electrical signal; equalisation of received signals and converting the analogue signals into digital signals using an analogue to digital convertor. The digital signals can then be provided to a further processor, provided as part of the receiver apparatus or associated with the receiver apparatus, to be demodulated to extract communication data. An example of a typical receiver apparatus is described in more detail with reference to FIG. 4 where the conditioning circuitry and further processor correspond to an optical front end module and a baseband processor resource.

Any suitable modulation scheme may be used, for example orthogonal frequency division multiplexing (OFDM) modulation schemes are used in some embodiments, and the demodulation is a demodulation from the OFDM modulation scheme. In some embodiments, other modulation schemes may be used. An optical wireless communication transmitter and receiver can be provided together as a transceiver.

Figure 3:
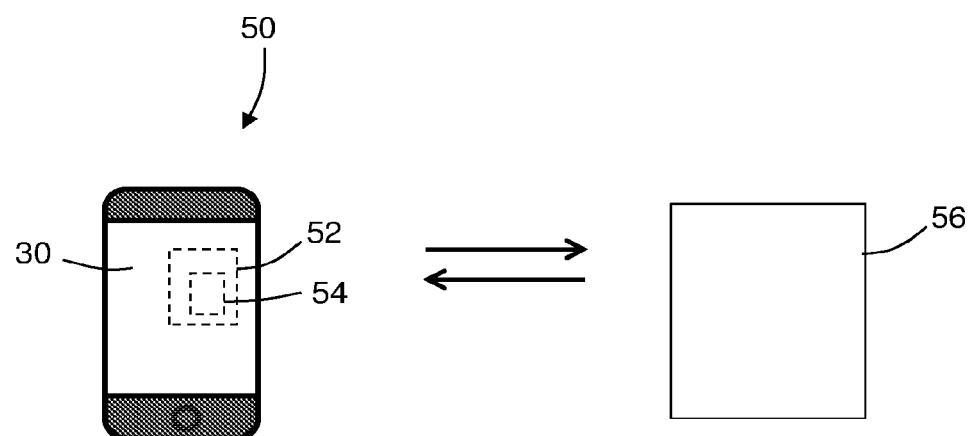
FIG. 3 is a schematic illustration of LiFi communication between a mobile device and an access point.

FIG. 3 is a schematic illustration of a mobile phone 50 into which the LiFi enabled screen 30 that is shown in FIG. 2 is integrated. The mobile phone 50 also comprises an OWC transceiver 52, which is positioned behind the display screen 30 (this positioning is illustrated by the OWC being represented by dashed lines). The OWC transceiver comprises a processor 54. The mobile phone also comprises further processors which are not part of the OWC transceiver 52. For example, the mobile phone comprises processors that are configured to process data and to drive the display of images on the display screen 30.

The OWC transceiver may form part of an OWC apparatus included in the display apparatus that may include further components to provide OWC transmission or detection in accordance with known OWC techniques, for example any suitable arrangement (not shown) of one or more of digital to analog and/or analog to digital converters, amplifiers, filter adjustable gain/attenuation component, LED driving circuitry.

In the present embodiment, the OWC transceiver 52 is a LiFi transceiver which is configured to receive data from, and send data to, other LiFi devices using modulated light. The OWC transceiver 52 may be considered to act as a station.

Methods that use light to transmit data wirelessly by modulation of the light may be referred to as optical wireless communications (OWC). LiFi (light fidelity) is a form of OWC which may in some circumstances be considered to be analogous to Wi-Fi in radio-frequency communications for at least some applications. There are however significant technical differences between LiFi and Wi-Fi. Any suitable LiFi protocol may be used, for example any protocol complying with a suitable standard.

FIG. 3 also shows a LiFi access point (AP) 56. AP 56 is configured to receive data from, and send data to, other devices using modulated light. For example, AP 56 is configured to receive data from, and send data to, mobile phone 50. AP 56 comprises a plurality of components which are not illustrated for clarity, but may comprise, for example, analog to digital and digital to analog converters, driver circuitry, amplifier circuitry, and processing circuitry. AP 56 further comprises at least one light source and at least one light sensor.

An embodiment is now described in which mobile phone 50 comprising screen 30 communicates with AP 56 using LiFi. However, in other embodiments, mobile phone 50 may communicate with any suitable device using optical wireless communications. In some embodiments, mobile phone 50 may communicate with multiple devices simultaneously or near-simultaneously. In some further embodiments, the OWC transceiver 52 is replaced with an OWC receiver without a transmitter, and mobile phone 50 is configured to receive, but not to transmit, OWC signals.

In use, an image is displayed to a user on display layer 36. The image may comprise, for example, a user interface of the mobile phone, a web browser, or content (for example, text content or video content) that is being viewed by the user. In some circumstances, the image may be a simple image, for example an image comprising a single colour, a limited range of colours, or a logo. In the present embodiment, a refresh rate of the image displayed to the user is 60 Hz (60 frames per second). In other embodiments, the refresh rate may be any suitable rate, for example between 30 and 200 Hz.

The AP 56 receives input data (for example, Ethernet data). A processor of the AP 56 encodes the input data using on-off keying. In other embodiments, any suitable modulation scheme may be used. Driving circuitry of the AP 56 drives a visible light source of the AP 56 (which in the present embodiment comprises at least one LED) to transmit the encoded data by modulation of an intensity of the light source. The modulated light from the AP 56 is thereby used to transmit a downlink data signal using modulated visible light.

Part of the light transmitted by the AP 56 is incident on the front of the screen 30. A direction of incidence of the light on the screen 30 is illustrated by arrow 44 in FIG. 2. In the embodiment shown in FIG. 3, the light is incident at an angle perpendicular to a plane of the screen. In other embodiments, light may be incident on the front of the screen from any appropriate angle.

The light incident on the screen 30 passes through the protective glass layer 32, the capacitive circuit plane 34, and the display layer 36. Some of the light incident on the screen may be lost to reflection or absorption when light passes through the protective glass layer 32, the capacitive circuit plane 34, and the TOLED matrix layer 36. However, in the present embodiment, most of the light that is incident on the screen 30 passes through the TOLED matrix layer 36 onto the backplane layer 38. At least part of the light that is incident on the screen 30 is received by the photodiodes 42. In some embodiments, the light received by the photodiodes 42 is filtered by at least one optical filter and/or amplified by at least one optical amplifier. The photodiodes also receive some light that is emitted by the TOLEDs of the display layer 36.

Light received by the photodiodes 42 is converted into electrical signals and passed to the processor 54 of the OWC transceiver 52. The processor 54 processes the electrical signals to obtain the downlink data signal that was transmitted by the AP 56.

The processor 54 is configured to process the electrical signals to distinguish light emitted from the TOLEDs from the light received from the AP 56. Since a TOLED may emit light in both directions, light emitted from TOLED display elements of the display layer 36 may arrive at the photodiodes 42 along with the light received from the AP 56. In the present embodiment, light from the display layer 36 appears to the OWC transceiver 52 as a low-frequency interference signal. The frequency spectrum of the interference signal is around the refresh rate of 60 Hz, which is much lower than a frequency of modulation of the modulated visible light. The processor 54 of the OWC transceiver 52 removes the light that originated from the display layer 36 by using signal processing techniques. In other embodiments, any suitable method may be used to distinguish light emitted from the display layer 36 from light received through the display layer. For example, the light may be filtered by wavelength, or the undesired low-frequency signal may be filtered electrically in the analog electronics part of the receiver system.

In the present embodiment, a propagation profile of the light received by the photodiodes 42 is changed by passing through the TOLED matrix of display layer 36. (In other embodiments, the propagation profile may be changed by passing through the cover layer 32, the capacitive layer 34, or any other layer that is in front of the photodiodes 42.) The change in the propagation profile may comprise a change in frequency, direction, or polarisation of the light. The change in propagation profile may comprise aberration, dispersion, refraction or diffraction. The change in the propagation profile may result in a distortion of communication coverage.

The processor 54 is configured to compensate for the change in the propagation profile using digital signal processing techniques. In other embodiments, optics of the photodiodes 40 may be configured to at least partially correct for the change in the propagation profile. For example, at least one optical component (for example, at least one lens) may be used to compensate for a change in propagation profile.

The processor 54 demodulates the received signals to obtain the downlink data signal that was transmitted by the AP 56.

In addition to receiving downlink data from the AP 56 using modulated visible light, the OWC transceiver 52 is configured to drive the IR LED 40 to emit an uplink data signal using modulated infrared light. The OWC transceiver encodes uplink data using a suitable modulation scheme and drives the IR LED 40 to transmit the encoded uplink data by modulation of the IR light emitted by the IR LED 40.

The IR LED 40 is independent of the TOLEDs that are used to form the image on the display layer 36. In the present embodiment, the IR LED 40 operates at different frequencies from the TOLEDs of display layer 36.

Infrared light from the IR LED 40 is emitted through the TOLED matrix display layer 36. For example, the infrared light from IR LED 40 may travel in a direction opposite to that of arrow 44. The infrared light passes through the display layer 36, capacitive layer 34 and cover layer 32 to exit the screen 30. The uplink data signal may be emitted while an image is being displayed on display layer 36. The light from IR LED 40 is received and by an optical detector of the AP 56 and processed by AP 56 to obtain the uplink data signal by demodulation of the IR light transmitted by IR LED 40.

Using infrared light for uplink may avoid a bright visible light being produced while uplink data is being transmitted, for example a bright visible light which may shine into the user's face.

Although a single AP 56 and mobile device 30 are described above, in other embodiments a mobile device 30 may transmit signals to and/or receive signals from a plurality of APs or other computing devices. An AP may transmit signals to and/or receive signals from a plurality of mobile devices 30 or other computing devices.

By integrating the optical transceiver 52 behind a transparent display matrix, the optical transceiver 52 may become inconspicuous from the user perspective. Using the transparent display matrix, the OWC transceiver 52 may be provided with a sufficiently unobstructed path to successfully emit the radiation (IR light in the embodiment of FIG. 3) required for uplink communication as well as a sufficiently unobstructed path to successfully receive the radiation (visible light in the embodiment of FIG. 3) required for downlink communication.

Furthermore, the technology used in the embodiment of FIGS. 2 and 3 may allow for additional electrical components which operate with light to be integrated within the mobile phone 50, or within any other device. Such components may include, for example, light-based motion detectors, cameras, optical sensors, solar cells, proximity sensors, or a flashlight. A component integrated into mobile phone 50, or into another electronic device, may comprise any device that requires emission or reception of light. The component may be any device that emits and/or receives light at a wavelength to which the display screen is at least partially transparent.

In embodiments, any suitable light-transmitting and/or light-receiving OWC device may be positioned behind the display layer 36, for example mounted on backplane 38. For example, the light-transmitting and/or light-receiving device may be an optical wireless communications (OWC) transceiver, an OWC receiver, an OWC transmitter, a light-based motion detector, a camera, a solar cell, a proximity sensor, or a flashlight. In some embodiments, more than one type of light-transmitting and/or light-receiving device is positioned behind a single display layer 36. For example, different devices may be positioned behind different regions of the display layer 36.

The light-transmitting and/or light-receiving device may comprise any suitable light detector, for example a photodiode, avalanche photodiode (APDs), single-photon avalanche photodiode (SPADs), photomultiplier tube, solar cell, photodiode operated in a solar cell mode (forward biased), vertical cavity surface-emitting laser (VCSEL), silicon photomultiplier (SiPM) and multi pixel photon counter (MPPC). The light-transmitting and/or light-receiving device may comprise any suitable light source, for example an LED or laser diode.

Light that is incident on the TOLED matrix of the display layer 36 passes through the LEDs (excluding any light lost due to reflections and absorption when light passes through the different materials) and reaches an optical detector or optical detector optics under the TOLED matrix. Any light-receiving device may be used as an optical detector. The light-receiving device may or may not include photodiodes.

Light from any light-emitting device positioned behind the display layer 36 (for example, light from the IR light from a LiFi transmitter or the IR light from a proximity sensor) may pass through the TOLED matrix of the display layer 36 and be emitted outward from the device. Changes to the received or transmitted light propagation profile may be corrected by respective adjustments in the optics of the emitter/detector and/or by digital signal processing techniques. Received data may be processed using any suitable processor, which may or may not be part of an OWC transceiver. In some embodiments, multiple processors of the mobile device 50 may be used to process data received by a light-receiving device.

A light-transmitting device positioned behind a display layer may be independent of the light sources (for example, the TOLEDs of the display layer) whose light is used to form the image for display. The light sources used to form the display image may be different from light sources used for communication (for example, for OWC communication).

In one embodiment, sensor elements of a camera (for example, CCD or CMOS elements) are positioned on the backplane surface 38. The sensor elements receive light that passes through the display layer 36, and use that light to form an image.

Changes to the propagation profile of the light passing through the display layer 36 may cause distortion of the image that is captured by the imaging camera. Such changes may be corrected by at least one optical component and/or by signal processing in a processor. The processor may or may not be part of the camera. In one embodiment, signal processing by a processor is also used to remove the effects of any light emitted backwards by the TOLEDs and received by the sensor elements of the camera.

In another embodiment, a processor is configured to switch off TOLEDs potentially affecting the camera module (for example, TOLEDs that are in front of the sensor elements) for a brief moment while a picture is being taken by the camera. For example, part or all of the display layer may be switched off for $\frac{1}{30}$ or $\frac{1}{60}$ of a second. In some embodiments, a time period for which at least part of the display layer is switched off may be between 0.001 seconds and 1 second, for example depending on an acquisition time of the camera. In other embodiments, some or all of the display elements may be turned off or reduced in intensity for any time period during which any suitable device behind the display layer is receiving and/or transmitting light. In some embodiments, the switching on and off (or intensity reduction) of the display screen may be synchronised with pulsed signals, for example with LiFi pulses. The switching on and off (or intensity reduction) of the display screen may be synchronised with a modulation of light transmitted by a device behind the display layer.

In one embodiment, an IR LED and photodiodes mounted on the backplane 38 are used as a proximity detector. IR light emitted from IR LED passes through layers 36, 34 and 32 and is emitted from the screen 30, for example in a direction substantially perpendicular to the plane of the screen 30. Part of the IR light is reflected from an object situated in front of the screen 30. The reflected IR light passes into the screen 30 through layers 32, 34 and 36 and is detected by the photodiodes. The photodiodes convert the reflected IR light into electrical signals. The mobile device into which the screen 30 is integrated comprises a processor that is configured to use the signals from the photodiodes that are representative of the reflected LED light to determine the proximity of the object. In some embodiments, an optical wireless communications transceiver is configured to act as a proximity detector.

In another embodiment, a solar cell is positioned on the backplane surface 38. For example, the solar cell may comprise a plurality of photodiodes. The solar cell may be configured to receive visible, infrared and/or ultraviolet light through the display layer.

The solar cell is configured to convert received light into power which is used to power the mobile device. In some embodiments, the solar cell is used as an optical wireless communications detector and/or as a proximity sensor detector. In some embodiments, the solar cell is configured to detect light levels, for example ambient light levels.

By positioning light-transmitting and/or light-receiving devices behind the display layer, it may be possible to take advantage of the entire mobile device display area for placing opto-electronic components, for example opto-electronic components suitable for OWC, optical sensing, or solar power generation. In the electronic device described above with reference to FIGS. 2 and 3, the design of the electronic device enables a an OWC transceiver 52 to be integrated when a transparent display matrix 36 is employed. In addition, other opto-electronic components including but not limited to light-based motion detectors, cameras, optical sensors, solar cells, proximity sensors or flashlights may be integrated using the technique described above.

A commercial example may be the integrated camera module and the proximity sensor on a mobile phone, which using the technique above may be integrated behind a display matrix in a display region instead of in a non-display region such as a bezel. Using the transparent display, visible light captured by the camera sensor may have a sufficiently unobstructed path between the image that is being captured and the sensor itself, while the infrared light emitted and received by the proximity sensor may have a sufficiently unobstructed path between the sensor and incoming IR radiation to make the detection.

In some circumstances, components can be made inconspicuous irrespective of their size by positioning them behind the display.

Benefits may be provided with regard to the limited space that may become available for other optical components due to the tendency to reduce the mobile device screen bezel. In some circumstances, by positioning light-transmitting and/or light-receiving devices behind the display layer instead of in regions outside the display region of a mobile device, the bezel of the mobile device could potentially be removed completely.

Integrating a solar cell into a mobile device, for example by placing the solar cell behind the display layer, may in some circumstances significantly increase the battery life of the mobile device. In some embodiments, the entire screen area may become available for the integration of a solar cell, for example a high-efficiency solar cell. An amount of power that may be captured by a solar cell may be dependent on a size of the solar cell.

In some embodiments, positioning photodetectors behind the display layer may enable the use of large area photodetectors and/or the use of multiple photodetectors, due to the large area available behind the display layer. When the photodetector or photodetectors are not confined to the bezel, larger photodetectors or a greater number of photodetectors may be used.

In some embodiments, the use of large area and/or multiple photodetectors may lead to significant reduction or removal of any receiver and/or transmitter optics. In some systems, receiver and/or transmitter optics may be positioned in front of a receiver and/or transmitter in order to collect more light. When the effective area of the photodetector or photodetectors is large enough, then in some circumstances enough light may be captured without using such optics, or the optics used may be reduced.

In some embodiments, positioning transmitters behind the display layer may enable the use of scattered and/or large area transmitters. For example, a transmitter may occupy a larger area when placed behind the display layer than when placed in a bezel. In some embodiments, a plurality of transmitters are placed at locations across the display region. In some embodiments, one or more large area transmitters occupies a significant proportion of the display region, for example 10% of the display region.

The use of scattered and/or large area transmitters may alleviate constraints due to eye safety. If a single, small light source is used, eye safety regulations may set limits on the amount of light that may be emitted from that light source. For example, a level of emitted infrared light may be restricted to prevent eye damage. When the effective area of the transmitter or transmitters is larger, then radiated light (for example, radiated infrared light) is distributed over a larger area, which may relax eye safety constraints. For example, a higher total amount of light may be emitted when it is distributed over an entire display region than when it is emitted from a single, small light source.

In the embodiment of FIG. 2, IR LED 40 and photodiodes 42 are integrated into the backplane of a LiFi enabled screen 30. In other embodiments, any light-transmitting and/or light-emitting device or devices may be positioned on the backplane 38. In further embodiments, any suitable light-transmitting and/or light-receiving device or devices may be positioned in any suitable location behind the display layer. For example, different devices may be positioned behind different parts of the display layer. In some embodiments, the screen comprises multiple layers behind the display layer instead of or in addition to the backplane, and light-transmitting and/or light-receiving devices may be positioned on any one of those multiple layers.

By using a light-transmitting device that is separate from the light sources that form the display, a device may be adapted for both display and communication (for example, OWC communication). In some circumstances, screen LEDs (for example, TOLEDs) that form a display may have relatively low modulation speeds and low power output. In some circumstances, screen LEDs may not be suitable for communication, or may be suitable for communication only over short distances.

If the screen LEDs were to be used for communication, they may be very bright in order to deliver high data rates at distances used for communication, for example at practical distances that are suitable for LiFi type of connectivity. The use of infrared light for uplink communication may avoid the situation where there is a bright light shining into a user's face.

In FIG. 2, electro-optics are integrated into a screen 30 which may be mounted into a mobile phone as a single unit. In a further embodiment, illustrated in FIG. 4, a display apparatus comprises a transparent display screen 60, which is already a complete and fully operational transparent display, and optical sensor and/or communication devices which are integrated behind the transparent TOLED display screen 60.

Figure 4:
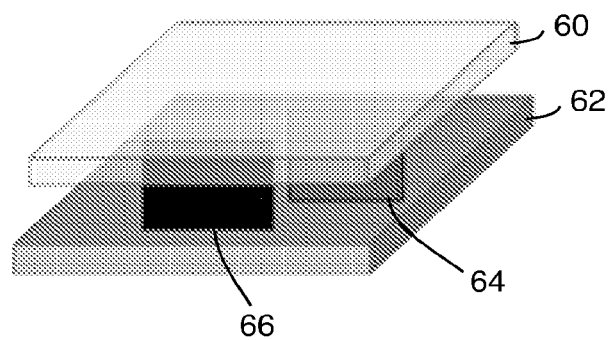
FIG. 4 is a schematic illustration of an integrated LiFi module employing a TOLED display camouflage in accordance with an embodiment.

The transparent display screen 60 may comprise a cover layer, capacitive layer, backplane and/or other layers. The transparent display screen 60 is already packaged without the optical sensor and/or communication devices being integrated into the display package. The display screen 60 may also comprise connectors configured to connect the display screen to other components of the mobile phone. In the embodiment of FIG. 4, the optical sensor and/or communication modules are not packaged as part of the display screen 60, but are placed beneath the display screen 60.

In the embodiment illustrated in FIG. 4, the optical sensor is a photodiode 66 and the optical communication device is an IR LED 64. Photodiode 66 and IR LED 64 are mounted on a further layer 62 which is not part of the integrated display screen 60. The photodiode 66 and IR LED 64 may be packaged in additional packaging, other than the packaging of the display screen 60. In other embodiments, any light-transmitting and/or light-receiving device may be positioned behind the integrated display screen 60. The light-transmitting and/or light receiving device may or may not require additional packaging.

In the embodiment of FIG. 4, the screen 60, which can display an arbitrary image or colour, can be used to camouflage the optical sensor module 66 underneath. The camouflaging of devices placed behind the screen 60 may facilitate a more appealing integration of the devices within a larger electronic device or within an ambient environment. The screen 60 may hide a photodetector and/or emitter. The hiding of the photodetector and/or emitter may or may not be for aesthetic reasons.

Placing light-transmitting and/or light-receiving devices behind a separate complete transparent screen may allow the screen to be fabricated separately from the light-transmitting and/or light-receiving devices.

In the embodiments of FIGS. 2 to 4, TOLED technology is used to address the issue of integrating optical detectors and emitters in electronic devices that employ a display.

Figure 5:
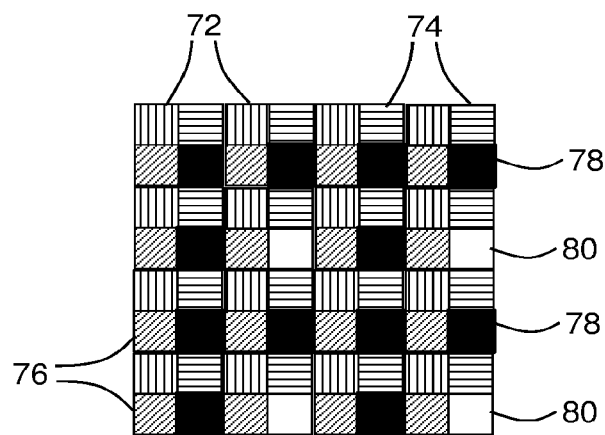
FIG. 5 is a schematic illustration of an RGB display matrix with integrated photodetectors and IR LEDs in accordance with an embodiment.

FIG. 5 is an illustration of a further embodiment in which a different integration method is used to integrate detectors and emitters used in optical wireless communication into a display matrix of a screen. The embodiment of FIG. 5 may not require a transparent display matrix, since the detector and emitter are integrated in place of individual pixels or groups of pixels in a display matrix.

In the embodiment of FIG. 5, a display layer comprising a display matrix is used to present an image to a user. The display layer may be positioned behind a protective glass layer and capacitive circuit layer, for example similar to those shown in FIG. 2. FIG. 5 shows a front view of a part of the display matrix, for example as viewed by a user in a direction perpendicular to a plane of the display layer. The layout of the part of the display matrix illustrated in FIG. 5 may be repeated over the rest of the display layer.

The display matrix comprises a plurality of display elements, which may also be called pixels. In the embodiment of FIG. 5, the display elements are OLEDs. In other embodiments, any suitable display elements may be used, for example TOLEDs. In some embodiments, the display elements may be backlight LEDs of an LCD screen.

The plurality of display elements comprises a plurality of red display elements 72, a plurality of green display elements 74, and a plurality of blue display elements 76. In FIG. 5, the red display elements 72 are represented by vertically-striped squares, the green display elements 74 are represented by horizontally-striped squares and the blue display elements 76 are represented by diagonally-striped squares.

Between the display elements are positioned a plurality of photodiodes 78 and a plurality of IR LEDs 80. In FIG. 5, the photodiodes 78 are represented by black squares and the IR LEDs 80 are represented by white squares.

The part of the display layer illustrated in FIG. 5 includes four repetitions of a unit cell which comprises a square of four elements by four elements. The component elements of the unit cell are a mixture of display elements 72, 74, 76, photodiodes 78, and an IR LED 80.

Starting from the top left hand side of the unit cell, a first row comprises in order from left to right a red display element 72, a green display element 74, a further red display element 72 and a further green display element 74. A second row comprises a blue display element 76, a photodiode 78, a further blue display element 76 and a further photodiode 78. A third row is the same as the first row. A fourth row comprises a blue display element 76, a photodiode 78, a further blue display element 76 and an IR LED 80.

Photodiodes 78 and LEDs 80 are interspersed within the display elements 72, 74, 76 such that each photodiode 78 or LED 80 is surrounded by display elements 72, 74, 76.

In other embodiments, if an RGB display comprises red, green and blue LEDs in a repeating pixel configuration, then a fourth IR LED or a sensor (for example, a photodiode) may be integrated in as part of the pixel configuration.

In further embodiments, the photodiodes and/or LEDs are arranged in one or more rows or columns. In such embodiments, instead of each photodiode 78 or LED 80 being surrounded by display elements 72, 74, 76, each photodiode 78 or LED 80 may be adjacent to at least one further photodiode 78 or LED 80. In some embodiments, one or more rows or columns of photodiodes and/or LEDs are placed along one or more edges of an array of display elements 72, 74, 76. In some embodiments, one or more rows or columns of photodiodes 78 and/or LEDs 80 are placed within an array of display elements 72, 74, 76. For example, a row of photodiodes 78 and/or LEDs 80 may be placed between two rows of display elements 72, 74, 76.

Although FIG. 5 shows an example in which the photodiodes 78 and LEDs 80 are of a similar size to the display elements 72, 74, 76, in other embodiment any relative sizes of photodiodes, LEDs or display elements may be used. The photodiodes and/or LEDs may be replaced or supplemented by any suitable light-transmitting and/or light-receiving devices.

The photodiodes may be replaced or supplemented by any suitable photodetectors, for example avalanche photodiodes (APDs), single-photon avalanche photodiodes (SPADs), photomultiplier tubes, solar cells, photodiodes operated in a solar cell mode (forward biased), vertical cavity surface-emitting laser (VCSEL), silicon photomultiplier (SiPM) and multi pixel photon counter (MPPC). The LEDs may be replaced or supplemented by any suitable light emitters, for example laser diodes.

By integrating light-transmitting and/or light-receiving devices into the display layer rather than into a further layer, the devices may have a substantially unobstructed light path into or out of the screen. The devices may be integrated into the display screen rather than taking up space in a non-display region, for example a bezel of a mobile phone. This may allow a bezel to be reduced in size or eliminated.

A light-transmitting device that is integrated into the display layer may have a different wavelength, modulation speed and/or power to that of the light sources used to form the image. In some circumstances, light sources used to form an image may have low modulation speeds and/or low power output. The light-transmitting device may have a higher power output and/or a faster modulation speed.

FIG. 5 shows a display matrix that incorporates display elements and photodiodes. In other embodiments, a display matrix that incorporates different optical elements or hardware components, in particular, components of optical front end receivers may be provided.

Figure 6:
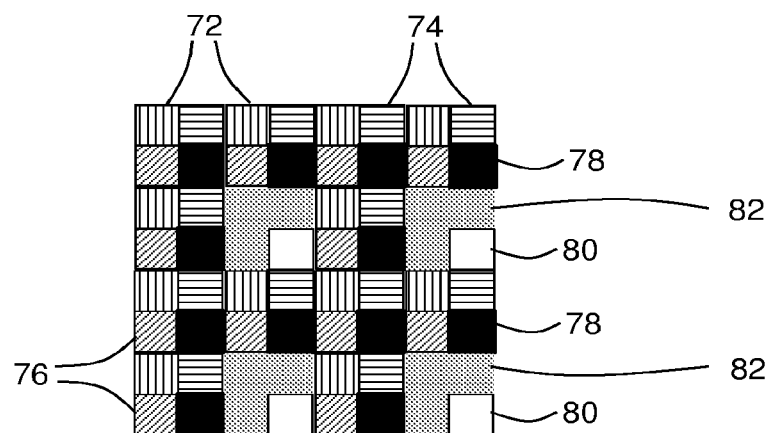
FIG. 6 is a schematic illustration of an RGB display matrix with integrated photodetectors and IR LEDs in accordance with an embodiment.

FIG. 6 is an illustration of a further embodiment in which a different integration method is used to integrate detectors and emitters used in optical wireless communication into a display matrix of a screen. As in FIG. 5, the part of the display layer illustrated in FIG. 6 include four repetitions of a different unit cell which comprises a square of four elements by four elements. As in FIG. 5, the component elements of the unit cell are a mixture of display elements 72, 74, 76, photodiodes 78, and an IR LED 80. The unit cell of FIG. 6 also has component elements that are front end electronic elements 82. The front end electronic element includes any component found in an optical front end for optical wireless communication, for example, driving circuitry elements, amplifying circuitry elements, buffering circuitry elements or multiplexing circuitry elements.

As in FIG. 5, FIG. 6 shows photodiodes 78 represented by black squares and IR LEDs 80 are represented by white squares. The front end electronic elements 82 are represented by grey squares. Starting from the top left hand side of the unit cell, a first row comprises in order from left to right a red display element 72, a green display element 74, a further red display element 72 and a further green display element 74. A second row comprises a blue display element 76, a photodiode 78, a further blue display element 76 and a further photodiode 78. A third row comprises a red display element 72, a green display element 74, a first part of a front end electronic element 82 and a second part of a front end electronic element 82. A fourth row comprises a blue display element 76, a photodiode 78, a third part front end electronic element 82 and an IR LED 80.

Figure 7A:
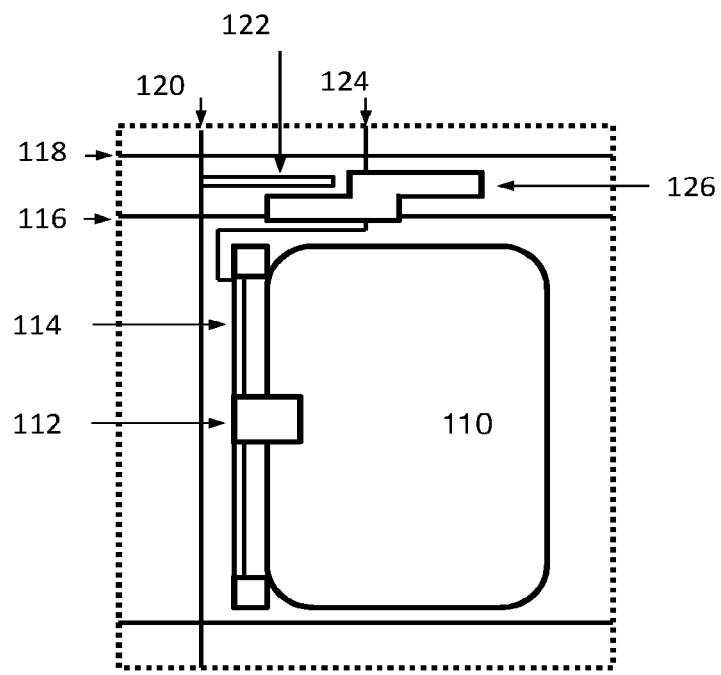
FIGS. 7(a) and 7(b) show a schematic illustration of a pixel structure of a display with an integrated OWC transmitter and receiver.

In some embodiments, each pixel of a display apparatus comprises an OWC transmitter and receiver, together with usual pixel circuitry and display elements. FIG. 7 illustrates one example embodiment.

FIG. 7(*a*) shows a structure of an OLED and associated circuitry according to embodiments The associated circuitry include an aperture 110, an indium tin oxide (ITO) contact 112, a thin-film-transistor (TFT) driver 114, a capacitance line 116, a scan line 118, a data line 120, a switching TFT 122, a supply line 124 and a capacitor 126.

FIG. 7(*b*) shows a pixel structure of a display with an integrated OWC transmitter and receiver. FIG. 7(*b*) show an aperture 90 that includes a red display element 92, a green display element 94, a blue display element 96. The pixel structure also has an IR LED 98 and a photodiode 100.

Figure 7B:
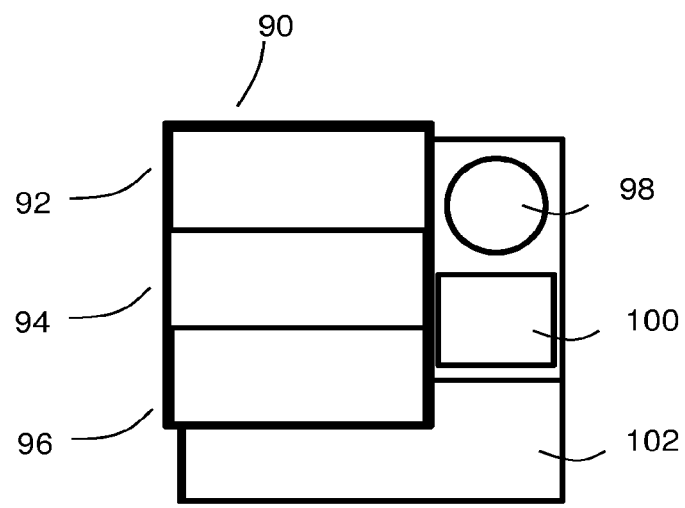

Additional circuitry is shown schematically in FIG. 7(b) and is included as part of the pixel. The additional circuitry may include optical front end circuitry for OWC. The IR LED 98 and photodiode 100 and optical front end circuitry 102 allow the pixel to be used as part of an OWC device.

The above pixel structure allows OWC functionality to be integrated into any display technology, for example LCD, OLED or RGB LED. By utilizing a plurality of these pixel structures in a display, the entire display area may be used to transmit and receive data thus minimizing any risk of the signal being lost. The pixel structure may also allow OWC to be integrated into any device with a display, including TVs, smart banners, monitors etc. The pixel structure of FIG. 7(b) may be incorporated into the display matrix illustrated in FIGS. 5 and 6.

In some embodiments, OWC signals may be generated by using light emitting devices that are used for display. For example, one or more of the display LEDs may be modulated to send optical signals by the display. Data transmission may be synchronised with display signals. For example, if a scene or image that is being displayed on the display screen is mostly red, then the red LEDs may be modulated to send optical communication signals. Should the scene move to a scene that is mostly blue, for example, then the blue LEDs may be modulated to send optical communication signals. In such a case, photodiodes may be provided as part of the display screen itself or behind the display screen.

Further embodiments of the screen, illustrated in FIGS. 2 to 4, and the display matrix, illustrated in FIGS. 5 and 6 are now described in the following. As discussed above, the light transmitting and light receiving devices may comprise an array of electro-optic devices. In some embodiments, the screen and/or the display matrix are configured to comprise optical communication devices sensitive to different wavelengths that occupy separate regions.

In a first example embodiment, more than one OWC receiving region is provided. The more than one OWC receiving regions may be provided on a separate layer to the display, for example, on the backplane of the screen, illustrated in FIGS. 2 to 4. Alternatively, the more than one OWC receiving regions may be formed as part of the display matrix by selecting photodiodes that are sensitive to different wavelengths in the unit cells. In some embodiments, the display matrix is arranged to have a first region comprising a repeated pattern of a unit cell having a photodiode sensitive to a first wavelength and a second region comprising a repeated pattern of a unit cell having a photodiode sensitive to a second wavelength. Further regions sensitive to further wavelengths may be provided. In some embodiments, four receiving regions may be provided arranged in quadrants.

Each of the receiving regions is configured to receive OWC signals on a different optical wavelength. This may be achieved by providing appropriate filters or other optical elements that permit only light of a certain wavelength to pass to the photodiodes of the receiving region. A plurality of filters or other optical elements or a single filter or optical element may be used. Alternatively, a first OWC receiving region may comprise photodiodes of a first photodiode type and a second OWC receiving region may comprise photodiodes of a second photodiode type, such that the first and second photodiode types are different and the first and second photodiode types are sensitive to light of a first and a second wavelength, respectively. In some embodiments, more than two OWC regions with corresponding photodiode types can be provided.

In some embodiments, each receiving region is sensitive to light having a distinct wavelength in the IR spectrum.

In some embodiments, each receiving region is provided with associated signal collection circuitry for collecting and summing analogue detection signals from each of the photodiodes in the receiving region. The collection circuitry thus produces a summed, or otherwise combined, signal(s) for each receiving region. Signals from photodiodes arranged at different distances from the collection circuitry may take different times to arrive at the collecting circuitry. Therefore, the collection circuitry may have a processor or further synchronisation circuitry configured to off-set collection times from different diodes so that the collected signal of the collection circuitry corresponds to a sum of received signals at one moment in time.

In addition, in some embodiments, the collection circuitry for each receiving region may have an associated amplifier per receiving region. The amplifier per receiving region may be arranged to amplify the summed signal and to provide the amplified signal to an ADC.

By providing different receiving regions, multiplexing of received signals may be achieved allowing the apparatus to receive signals over more than one optical wavelength channel. Thus, data rate and/or bandwidth of received signals may be increased.

Returning to the LiFi enabled screen, as shown in FIG. 2, and related embodiments as described above, the display layer 36 comprises a matrix of TOLEDs and the backplane layer 38 has a plurality of electro-optical devices including, in some embodiments, an IR LED 40 and a plurality of photodiodes 42. In a further embodiment, the IR LED 40 is provided on a different layer to the plurality of photodiodes. In some embodiments, the IR LED 40 is provided on the display layer 36 and the plurality of photodiodes are provided on the backplane player. In some embodiments, the IR LED 40 is provided on the backplane layer 38 and the plurality of photodiodes are provided on the display layer 36.

In a further embodiment, different epitaxy layers or films may be used to provide a transparent RGB transmitter and IR detector.

As an example, within the semiconductor, the upper layers may be shallower and hence more sensitive to shorter wavelengths of light such as ultra violet (UV) or blue wavelengths whereas deeper within the semiconductor, the device may be more sensitive for longer wavelengths, for example, infrared. In some embodiments, a thin film OLED may be provided as a laminated layer on the back of the display for receiving infrared.

Although, in some embodiments described above, the display apparatus is configured to emit infrared light for uplink communication and receive visible light for downlink communication, it should be understood that alternative embodiments can provide uplink communication using visible light and downlink communication using infrared light. Such functionality can be achieved by using a photodiode sensitive to IR light or suitable filters configured to filter infrared light for the photodiode. Also, visible LEDs can be driven to produce modulated optical signals.

It should be further understood that alternative embodiments can provide both uplink communication and downlink communication using infrared light. Such functionality can be achieved by using a photodiode sensitive to infrared light or suitable filters configured to filter infrared light for the photodiode and infrared LEDs or suitable filters configured to filter infrared light for the LED. In further alternative embodiments, both uplink communication and downlink communication can use visible light. Also, in further alternative embodiments, UV light can be used for at least one of the uplink communication and/or downlink communication.

In some embodiments, transmitting and receiving optical communication signals may be operated in half duplex or in full duplex mode.

In some embodiments, when receiving elements are provided on the backplane layer, filter elements may be provided on the display layer to filter the light as it passes through the display layer.

It will be understood that appropriate features from the display matrix embodiments may be combined with appropriate features from the display screen embodiments.

As described above, TOLED technology is used to address the issue of integrating optical detectors and emitters in electronic devices that employ a display. However, other LED technology may be used. In some embodiments, arrays of microLEDs may be provided. In some embodiments, microLED arrays may be implemented as part of the display matrix. In further embodiments, microLED arrays may be incorporated as part of the at least partially transparent display screen. In particular, as part of embodiment of FIG. 2, the microLED arrays may be provided as part of the display layer 36. In further embodiments, the microLED arrays or any other suitable LED devices may be provided as the electro-optical devices 40 and 42 in backplane layer.

Further discussion of microLEDs is hereby provided. The following provides some non-limiting examples of microLEDs suitable for optical wireless communication (OWC).

The following provides a focus on properties of microLEDs which are most useful for optical wireless communication.

Discussion of microLEDs can be found in: "Towards 10 Gb/s orthogonal frequency division multiplexing-based visible light communication using a GaN violet micro-LED", Vol. 5, No. 2, April 2017, Photonics Research by Islim et al; "A review of gallium nitride LEDs for multigigabit-per-second visible light data communications" by Rajbhandari et al., Semicond. Sci. Technol. 32 (2017) 023001; "A 3-Gb/s Single-LED OFDM-Based Wireless VLC Link Using a Gallium Nitride μLED" by Tsonev et al., IEEE PHOTONICS TECHNOLOGY LETTERS, VOL. 26, NO. 7, Apr. 1, 2014; and "High Bandwidth GaN-Based Micro-LEDs for Multi-Gb/s Visible Light Communications" by Ferreira et al., IEEE PHOTONICS TECHNOLOGY LETTERS, VOL. 28, NO. 19, Oct. 1, 2016.

Some parameters for a successful OWC system can include suitable values for electrical bandwidth; total radiant flux; thickness; beam output cone angle, and wallplug efficiency (electrical-optical efficiency). MicroLEDs may achieve suitable values of these parameters, as detailed below, by providing one or more arrays of microLEDs on a chip. MicroLEDs may provide a single low profile light source.

MicroLEDs may be used as a source, as follows. A first option is to provide a source comprising an microLED array with total output power of 0.1 W in an area of 1×1 mm² and with a tailored output angle distribution. A second option is to provide a multi-wavelength microLED array with different wavelength bands in subarrays with a total power and area similar to option 1. A third option is to combine red, green, blue and infrared microLEDs in a structured array while maintaining the bandwidth advantages of single microLEDs.

Figure 8:
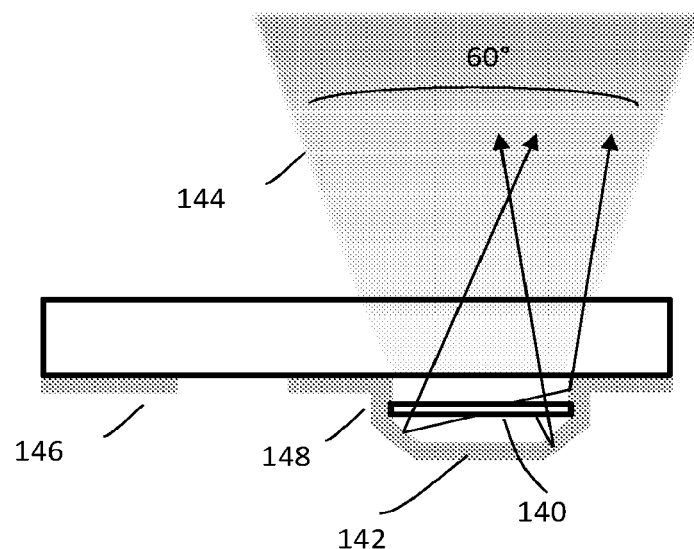
FIG. 8 is a schematic illustration of a microLED array.

FIG. 8 shows a microLED array with a tailored output angle distribution. By providing a tailored output angle distribution, the microLED array removes the need for using external optics to generate the required cone angle. FIG. 8 shows a target cone angle of the output from each microLED with a full-width half maximum of 60°. However, the cone angle may be tailored to other cone angle. As a further example, a cone angle having full width at half maximum (FWHM) of 90° is of interest.

The microLED array of FIG. 8 has a light emitting layer 140, from which light is emitted. Reflective sidewalls 142 are provided in a curved shape and provided at one side of the light emitting layer 140. The sidewalls 142 are shaped to reflect and direct light into a cone 144 of light that is characterised by a cone angle. FIG. 8 also shows an n-contact 146 and a p-contact 148 of the micro-LED.

To achieve a tailored output angle, a number of microLEDs can be combined to give the required peak output power of, for example, 100 mW from the array within the given target cone angle. For example, the desired wavelength of operation may be 900 nm. The system also needs to retain the advantages of microLEDs for LiFi applications of a high electrical bandwidth.

An initial list of design parameters and possible values of said parameters for the microLED array is as follows. Radiant flux may have a typical value of 0.1 W which covers the combined output from the array. The maximum thickness of die and carrier may be 5 mm, optionally 1 mm, optionally 0.5 mm. The array may have a width with a typical value of 5 mm, optionally 1 mm. The array may have a length with a typical value of 5 mm, optionally 1 mm. A typical desired wavelength of operation may be 900 nm and a typical wavelength range may be 880 to 920 nm. The spectral bandwidth may have a typical value of 50 nm. The electrical bandwidth, at 3 dB, may have typical minimum value of greater than 250 MHz, optionally 500 MHz. The wallplug efficiency may have a target value of 50%.

Figure 9:
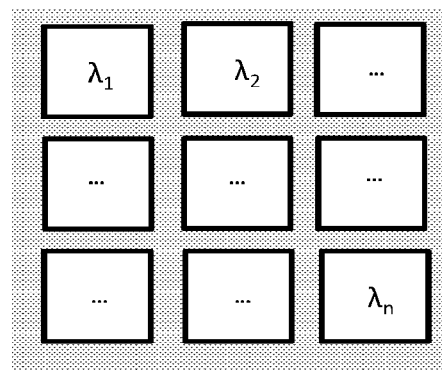
FIG. 9 is a schematic illustration of a multiwavelength microLED array.

A second option for a microLED array is shown in FIG. 9. FIG. 9 shows a multiwavelength microLED array. The array is subdivided into different regions, such that each region of the array is configured to operate at different wavelengths. For example, as shown in FIG. 9, a first region operates at a first wavelength, a second region operates at a second wavelength. Each region of the array comprises more than one microLED. Each region is addressed separately and modulated independently with separate data streams. The wavelength bands in each section are separated in spectral bandwidth and do not overlap spectrally with any other wavelength bands from other regions of the array.

An initial list of design parameters and possible typical values of said parameters for the microLED array may be as follows. Radiant flux may have a typical value of 0.1 W which covers the combined output from the array. The maximum thickness of die and carrier may be 5 mm, optionally 1 mm, optionally 0.5 mm. The array may have a width with a typical value of 5 mm, optionally 1 mm. The array may have a length with a typical value of 5 mm, optionally 1 mm. The cone angle, full-width half maximum, may have a typical value of 60 degrees. The spectral bandwidth of each wavelength band may have a typical value of 25 nm. The electrical bandwidth, at 3 dB, may have a typical minimum value of greater than 250 MHz, optionally 500 MHz. The wallplug efficiency may have a target value of 50%.

As an example, for the array of FIG. 8, typical values of wavelength ranges may be: for a first region, between 795 and 805 nm, typically 800 nm; for a second region, between 845 and 855 nm, typically 850 nm; for a third region between 895 and 905 nm, typically 900 nm.

Figure 10:
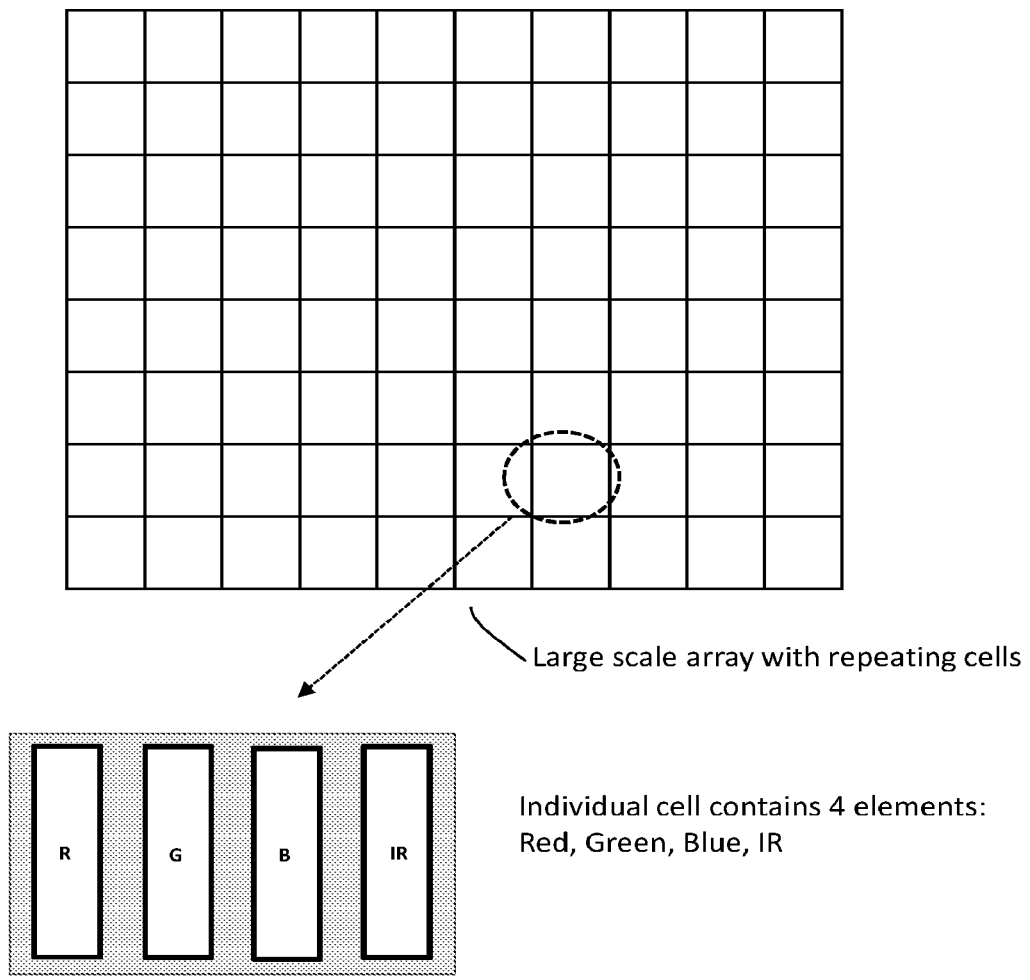
FIG. 10 is a schematic illustration of a structured addressable array of microLEDs.

A third option is illustrated in FIG. 10. FIG. 10 shows a structured addressable array. The array can be considered as repeating pattern of unit cells. Each cell has at least four microLEDs, each of which operates at a different wavelength. As a non-limiting example, FIG. 10 shows a unit cell that comprises, for example, a red, green, blue and IR microLED.

An initial list of design parameters and typical values of said parameters for the structured microLED array is as follows. Radiant flux may have a typical value of 0.1 W which covers the combined output from the array. The maximum thickness of die and carrier may be 5 mm, optionally 1 mm, optionally 0.5 mm. The array may have a width with a typical value of 7 cm. The array may have a length with a typical value of 11 cm. Each unit cell may have a size of 10 μm by 10 μm. The cone angle, full-width at half maximum, may have a typical value of 120 degrees. The electrical bandwidth, at 3 dB, may have a typical minimum value of greater than 250 MHz, optionally 500 MHz. The wallplug efficiency may have a target value of 50%.

In some embodiments, a typical value for power output of a single pixel with a diameter of 40-50 μm is about 2-5 mW from. In some embodiments, a pixel of approximately 10 μm in diameter has a typical value of power output of 0.1 mW.

As an example, for the array in FIG. 10, the four different microLEDs may operate in the following spectral bands: about 450 nm, about 530 nm, about 630 nm and about 850 nm, with each spectral band having a typical bandwidth value of 50 nm In further embodiments, different light source technology may be used as part of the screen. A discussion is presented of different display technology that may be used. These technologies may be used as part of a display screen, behind which LiFi transmitter and/or receivers can be placed, for example, the screen of FIG. 2, and/or as part of an array that incorporate LiFi elements, for example the display of FIG. 5.

In some embodiments, TOLEDs, microLEDs, quantum dot LEDs (qLED) and lightfield displays may be used as part of the display screen, behind which LiFi transmitter and/or receivers can be placed. TOLEDs may offer the advantage that a standard LiFi platform may be used that does not incorporate emissive display elements and/or the display area can be curved. In addition, LiFi performance works in favour of display performance by enhancing contrast. TOLEDs also offer the advantage of allowing a modular solution that can be fitted to different displays. This is advantageous if the physical placement is important to obtain an improved field of view. In these embodiments, MicroLED arrays may offer a small form factor and arrays may offer selective directivity. MicroLEDs also offer high bandwidth and multiple wavelength options. In these embodiments, qLED displays may provide the advantage that their use would enable increased uplink strength. qLED display uses wavelength converting elements to broaden gamut for example. As the qLED is typically placed in the backlight, it's easy to modulate and send out as a LiFi uplink signal. A power penalty may be that the efficiency of the emitter driver compared to standard backlighting. qLED would ultimately enable increased UL signal. Lightfield displays may offer the advantage of enabling bidirectional directivity.

As described above, different display technology can be provided in an array that incorporates LiFi elements. In such embodiments, microLEDs may offer the advantage that the LiFI platform can be integrated into a backplane and may offer high optical power uplink per pixel. In such embodiments, qLED display technology may offer the advantage that the LiFi components may be integrated into a backlight of the qLED display. In addition, qLED technology may provide a low complexity and low cost alternative. A lightfield display may offer the advantage that uplink and/or downlink efficiency could be increased.

Although embodiments above have been described in relation to a mobile phone, they may be implemented in any appropriate device having a display screen, for example a mobile phone, tablet, laptop or desktop computer, household appliance or point of sale device.

Embodiments have been described in which visible light is received and infrared light is transmitted. However, in other embodiments, any suitable wavelength of light may be transmitted and/or received, for example visible, infrared or ultraviolet light.

Whilst components of the embodiments described herein have been implemented in software, it will be understood that any such components can be implemented in hardware, for example in the form of ASICs or FPGAs, or in a combination of hardware and software. Similarly, some or all of the hardware components of embodiments described herein may be implemented in software or in a suitable combination of software and hardware.

It will be understood that the present invention has been described above purely by way of example, and modifications of detail can be made within the scope of the invention. Each feature disclosed in the description, and (where appropriate) the claims and drawings may be provided independently or in any appropriate combination.

The invention claimed is:

1. A display apparatus comprising:
   an at least partially transparent display, the display configured to generate light to form an image for display to a user positioned in front of the display, and
   at least one light-receiving device positioned behind the display,
   wherein the at least one light-receiving device is configured to receive modulated light comprising a downlink data signal through at least part of the display,
   wherein the transparency of the display through which the modulated light is received is independent of the image displayed on the display,
   wherein the at least one light-receiving device comprises or forms part of an optical wireless communications (OWC) apparatus and
   wherein the OWC apparatus is configured to decode the received modulated light to obtain the downlink data signal encoded in the received modulated light.

2. The display apparatus according to claim 1, wherein the transparency of the display through which the modulated light is received by the receiving device does not vary in dependence of at least one of image color and image intensity.

3. The display apparatus according to claim 1, wherein the modulation frequency of the received modulated light is between 100 kHz and 1 PHz.

4. The display apparatus according to claim 1, wherein the received modulated light is decoded according to a modulation scheme comprising at least one of: on-off keying (OOK), phase shift keying (PSK), M-ary pulse amplitude modulation (M-PAM), M-ary quadrature amplitude modulation (M-QAM) or orthogonal frequency division multiplexing (OFDM).

5. The display apparatus according to claim 1, wherein at least one of:

the display comprises a plurality of at least partially transparent display elements; or the display comprises a plurality of at least partially transparent display elements, wherein the plurality of at least partially transparent display elements comprises display elements of different colors.

6. The display apparatus according to claim 5, wherein the light receiving device operates at least one of a different wavelength, modulation speed or power output from the at least partially transparent display elements.

7. The display apparatus according to claim 1, wherein at least one of:

the display comprises at least one of transparent organic light-emitting diodes (TOLEDs), OLEDs, microLEDs, quantum dot LEDs, or lightfield display elements; or the display comprises a plurality of non-transparent display elements.

8. The display apparatus according to claim 1, further comprising at least one light transmitting device comprising or forming part of the optical wireless communications apparatus and positioned behind the display, wherein the at least one light transmitting device is configured to transmit light through at least part of the display.

9. The display apparatus according to claim 8, wherein at least one of:

the transmitting of light by the at least one light transmitting device is independent of an image displayed on the display;

the light transmitted by the at least one light transmitting device has a wavelength that does not vary with image content; or the at least one light transmitting device comprises a plurality of transmitters positioned behind the display.

10. The display apparatus according to claim 8, wherein at least one of:

the display comprises one or more display layers, wherein the at least one light transmitting device is positioned behind the one or more display layers;

the display comprises a display layer and comprises multiple layers behind the display layer and the at least one light transmitting device is positioned on any one of the multiple layers; or the at least one light receiving device is camouflaged by the presence of the display.

11. The display apparatus according to claim 10, wherein the signals representative of the light received are processed by the processor to at least one of identify, compensate for or at least partially remove a component of the signals that is representative of light emitted by at least part of the display.

12. The display apparatus according to claim 1, wherein at least one of:

the display comprises one or more display layers, wherein the at least one light receiving device is positioned behind the one or more display layers;

the display comprises a display layer and comprises multiple layers behind the display layer and the light receiving device is positioned on any one of the multiple layers; or the at least one light receiving device is camouflaged by the presence of the display.

13. The display apparatus according to claim 1, further comprising a processor for processing signals representative of light received by the at least one light receiving device.

14. The display apparatus according to claim 1, wherein at least one of:

the light received by the at least one light receiving device comprises at least one of: visible light, infrared light, or ultraviolet light; or the at least one light-receiving device comprises at least one of: a light-based motion detector, a camera, a proximity sensor, a flashlight, or a light level detector.

15. The display apparatus according to claim 1, wherein the display apparatus comprises at least one optical component configured to compensate for optical effects of the display.

16. The display apparatus according to claim 15, wherein the at least one optical component comprises at least one of: a lens, a lens array, a microlens array, liquid crystal displays, polarizers, an absorption filter, an interference filter, a Fabry-Perot filter, a dichroic filter, a band-pass filter, a tuneable filter, or a plasmonic filter.

17. The display apparatus according to claim 15, wherein the optical effects of the display comprise a change in a parameter of the transmitted or the received light, the change comprising at least one of: a propagation profile parameter, a wavelength, a polarisation parameter, a direction, an aberration parameter, a dispersion parameter, a refraction parameter, or a diffraction parameter.

18. The display apparatus according to claim 1, wherein the display apparatus is configured to at least one of: alter a property of light emitted by at least part of the display or alter operation of the display, during a time period in which light is received by the at least one light-receiving device through at least part of the display.

19. The display apparatus according to claim 18, wherein the display apparatus is configured to at least one of;

turn off part of the display for a selected duration;

turn off part of the display in synchronisation with a signal that is being received;

reduce display intensity for a time period; or reduce intensity for a time period in synchronisation with a modulation of a signal that is being received.

20. The display apparatus according to claim 18, wherein the at least one light-receiving device comprises sensor elements of a camera, and wherein the time period comprises a time period in which an image is acquired by the camera.

21. The display apparatus according to claim 1, wherein at least one of;

the at least one light receiving device comprises a large area photodetector, wherein the large area photodetector occupies at least one of: at least 10% of the display region, at least 20% of the display region, or at least 50% of the display region;

the at least one light-receiving device comprises a plurality of light-receiving regions, such that each light-receiving region is configured to receive modulated light having a different wavelength; or the at least one light receiving device comprises a plurality of photodetectors.

22. The display apparatus according to claim 1, wherein the at least one light receiving device comprises a solar cell, wherein the solar cell is configured to at least one of:

convert received light into power to at least partially power the display apparatus;

at least partially power an electronic device into which the display is connected;

charge a battery;

operate as an optical wireless communications detector;

operate as a proximity sensor detector; or detect ambient light levels.

23. A display apparatus according to claim 22, wherein the display apparatus comprises at least one of: a mobile phone, a tablet, a computer, a laptop, an automotive display, an aviation cockpit display, a television, a financial transaction terminal, or an industrial control panel.

24. A display apparatus according to claim 1, wherein the display apparatus comprises at least one of: a mobile phone, a tablet, a computer, a laptop, an automotive display, an aviation cockpit display, a television, a financial transaction terminal, or an industrial control panel.

25. A display apparatus comprising:
an at least partially transparent display the display configured to generate light to form an image for display to a user positioned in front of the display, and
at least one of a light transmitting device or a light-receiving device positioned behind the display,
wherein at least one of the light transmitting device or the light-receiving device is configured to at least one of transmit or receive modulated light through at least part of the display,
wherein the transparency of the display through which the modulated light is at least one of transmitted or received is independent of the image displayed on the display, and
wherein at least one of the light transmitting device or the light-receiving device comprises or forms part of an optical wireless communications (OWC) apparatus configured to at least one of: transmit modulated light comprising an encoded data signal or receive modulated light comprising an encoded data signal through the at least part of the display.

26. A display apparatus according to claim 25, where the OWC apparatus is configured to at least one of encode the data signal on the transmitted modulated light or decode the data signal from the received modulated light.

27. The display apparatus according to claim 25, wherein the transparency of the display through which the modulated light is at least one of transmitted or received does not vary in dependence of at least one of image color and image intensity.

28. The display apparatus according to claim 25, wherein at least one of:
the display comprises a plurality of at least partially transparent display elements, or
the display comprises a plurality of at least partially transparent display elements,
wherein the plurality of at least partially transparent display elements comprises display elements of different colors.

29. The display apparatus according to claim 28, wherein the at least one of the light transmitting or light receiving device operates on at least one of a different wavelength, modulation speed or power output from the display elements.

30. The display apparatus according to claim 25, wherein at least one of:
the display comprises at least one of: transparent organic light-emitting diodes (TOLEDs), OLEDs, microLEDs, quantum dot LEDs, or lightfield display elements;
the display comprises a plurality of non-transparent display elements; or
the light receiving device is camouflaged by the presence of the display.

31. The display apparatus according to claim 25, wherein at least one of:

the display comprises one or more display layers, wherein at least one of the light transmitting device or the light receiving device is positioned behind the one or more display layers; or
the display comprises a display layer and comprises multiple layers behind the display layer and at least one of the light transmitting device or the light receiving device is positioned on any one of the multiple layers.

32. The display apparatus according to claim 25, wherein the display apparatus comprises an optical component configured to compensate for optical effects of the display, wherein the optical component comprises at least one of: a lens, a lens array, a microlens array, liquid crystal displays, polarizers, an absorption filter, an interference filter, a Fabry-Perot filter, a dichroic filter, a band-pass filter, a tuneable filter, or a plasmonic filter.

33. The display apparatus according to claim 25, wherein at least one of:
the light transmitted or received by at least one of the light transmitting device or the light receiving device comprises at least one of visible light, infrared light, or ultraviolet light; or
at least one of the light transmitting device or the light-receiving device comprises at least one of: a light-based motion detector, a camera, a proximity sensor, a flashlight, or a light level detector.

34. The display apparatus according to claim 25, wherein the light generated by the display is visible light and the at least one of the light transmitting or light receiving device transmits or receives non-visible light.

35. The display apparatus according to claim 25, wherein the display apparatus is configured to at least one of: alter a property of light emitted by at least part of the display or alter operation of the display during a time period in which light is at least one of transmitted or received by the at least one of the light transmitting device or the light-receiving device through at least part of the display.

36. The display apparatus according to claim 35, wherein the display apparatus is configured to at least one of:
turn off part of the display for a selected duration;
turn off part of the display in synchronisation with a signal that is being received or transmitted;
reduce display intensity for a time period; or
reduce intensity for a time period in synchronisation with a modulation of a signal that is being received or transmitted.

37. The display apparatus according to claim 25, further comprising a processor for processing signals representative of light received by the light receiving device, wherein the signals representative of the light received are processed by the processor to at least one of: identify, compensate for or at least partially remove a component of the signals that is representative of light emitted by at least part of the display.

38. The display apparatus according to claim 25, wherein at least one of:
the light receiving device comprises a large area photodetector, wherein the large area photodetector occupies at least one of: at least 10% of the display region, at least 20% of the display region, or at least 50% of the display region;
the light-receiving device comprises a plurality of light-receiving regions, such that each light-receiving region is configured to receive modulated light having a different wavelength;
the light receiving device comprises a plurality of photodetectors;

the transmitting of light by the light transmitting device is independent of an image displayed on the display;

the light transmitted by the light transmitting device has a wavelength that does not vary with image content; or the light transmitting device comprises a plurality of transmitters positioned behind the display.

39. A method of operating a display apparatus, the display apparatus comprising:

an at least partially transparent display, the display configured to generate light to form an image for display to a user positioned in front of the display, and at least one of a light transmitting device or a light-receiving device positioned behind the display and comprising or forming part of an optical wireless communications (OWC) apparatus;

the method comprising at least one of transmitting modulated light comprising an encoded data signal through at least part of the display by the light transmitting device or receiving modulated light comprising an encoded data signal through at least part of the display by the light receiving device, wherein the transparency of the display though which the modulated light comprising the encoded data signal is transmitted or received is independent of the image displayed on the display.

40. The method of claim 39, wherein the transparency of the display through which the modulated light comprising the encoded data is at least one of transmitted or received does not vary in dependence of at least one of image color and image intensity.

41. The method of claim 39, wherein the light generated by the display is visible light and the at least one of the light transmitting or light receiving device transmits or receives non-visible light.

42. A method of operating a display apparatus, the display apparatus comprising:

an at least partially transparent display, the display configured to generate light to form an image for display to a user positioned in front of the display, and at least one light-receiving device positioned behind the display and comprising or forming part of an optical wireless communications (OWC) apparatus, the method comprising;

receiving modulated light comprising a downlink data signal by the light receiving device through at least part of the display, wherein the transparency of the display through which the modulated light is received is independent of the image displayed on the display; and decoding by the OWC apparatus the received modulated light to obtain the downlink data signal encoded in the received modulated light.

43. The method according to claim 42, wherein the display apparatus comprises a processor and the method further comprises processing by a processor the signals representative of the light received to at least one of identify, compensate for and or at least partially remove a component of the signals that is representative of light emitted by at least part of the display.

44. The method of claim 42, wherein the display apparatus comprises a processor and the method further comprises processing the signals representative of light received through at least part of the display by the at least one light receiving device based on at least one of a wavelength of the signals or a frequency of modulation of the signals.

* * * * *

UNITED STATES PATENT AND TRADEMARK OFFICE
CERTIFICATE OF CORRECTION

| | |
|---|---|
| PATENT NO. | : 12,107,627 B2 |
| APPLICATION NO. | : 18/296305 |
| DATED | : October 1, 2024 |
| INVENTOR(S) | : Dobroslav Tsonev et al. |

It is certified that error appears in the above-identified patent and that said Letters Patent is hereby corrected as shown below:

In the Claims

Claim 39, Column 35, Line 22, delete "though" and insert --through--.

Signed and Sealed this
Twenty-ninth Day of October, 2024

Katherine Kelly Vidal
*Director of the United States Patent and Trademark Office*